US007939882B2

(12) United States Patent
Su et al.

(10) Patent No.: US 7,939,882 B2
(45) Date of Patent: May 10, 2011

(54) INTEGRATION OF SENSE FET INTO DISCRETE POWER MOSFET

(75) Inventors: Yi Su, Sunnyvale, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 12/870,489

(22) Filed: Aug. 27, 2010

(65) Prior Publication Data
US 2010/0320461 A1 Dec. 23, 2010

Related U.S. Application Data

(63) Continuation-in-part of application No. 12/098,970, filed on Apr. 7, 2008, now Pat. No. 7,799,646.

(51) Int. Cl.
H01L 29/66 (2006.01)
(52) U.S. Cl. .......................... 257/328; 438/212
(58) Field of Classification Search .................. 257/328; 438/212
See application file for complete search history.

(56) References Cited

U.S. PATENT DOCUMENTS

| 5,079,456 | A | 1/1992 | Kotowski et al. |
| 5,408,141 | A | 4/1995 | Devore et al. |
| 5,962,912 | A | 10/1999 | Hierold |
| 6,140,680 | A | 10/2000 | Pulvirenti |
| 6,414,404 | B1 | 7/2002 | Allen |
| 7,118,951 | B2 | 10/2006 | Yedinak |
| 7,638,841 | B2 | 12/2009 | Challa |
| 7,799,646 | B2 | 9/2010 | Su |
| 2007/0131938 | A1 | 6/2007 | Williams |
| 2009/0039869 | A1 | 2/2009 | Williams |
| 2009/0236659 | A1 | 9/2009 | Gajda et al. |

OTHER PUBLICATIONS

Office Action dated Feb. 4, 2010 issued for U.S. Appl. No. 12/098,970.
Notice of Allowance and Fees Due dated May 12, 2010 issued for U.S. Appl. No. 12/098,970.
Office Action dated Sep. 29, 2010 issued for U.S. Appl. No. 12/860,777.
U.S. Appl. No. 12/860,777, filed Aug. 20, 2010.

*Primary Examiner* — Douglas M Menz
(74) *Attorney, Agent, or Firm* — Joshua D. Isenberg; JDI Patent

(57) ABSTRACT

A semiconductor device includes a main field effect transistor (FET) and one or more sense FETs. A transistor portion of the sense FET is surrounded by transistors of the main FET. An electrical isolation structure that surrounds the main FET is configured to electrically isolate source and body regions of the main FET from source and body regions of the sense FET. A sense FET source pad is located at an edge of the main FET and spaced apart from the transistor portion of the sense FET. The sense FET source pad is connected to the transistor portion of the sense FET by a sense FET probe metal. The isolation structure is configured such that the transistor portion of the sense FET and the sense FET source pad are located outside an active area of the main FET.

20 Claims, 24 Drawing Sheets

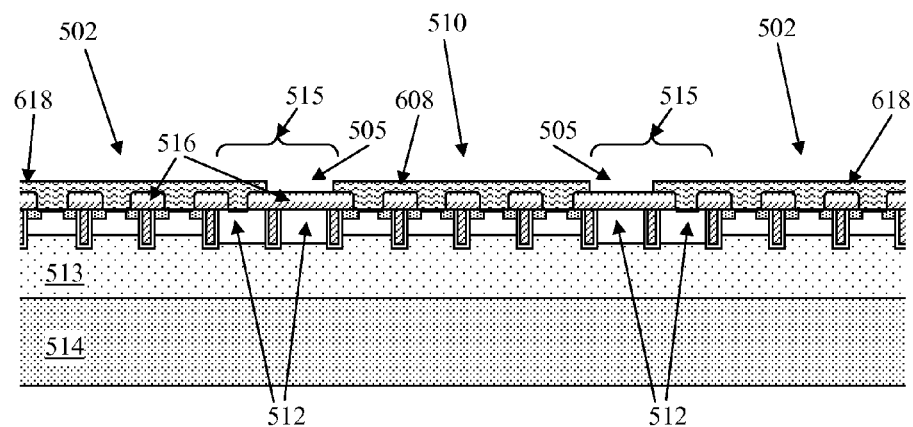
FIG. 6B (A-A' cross-section)
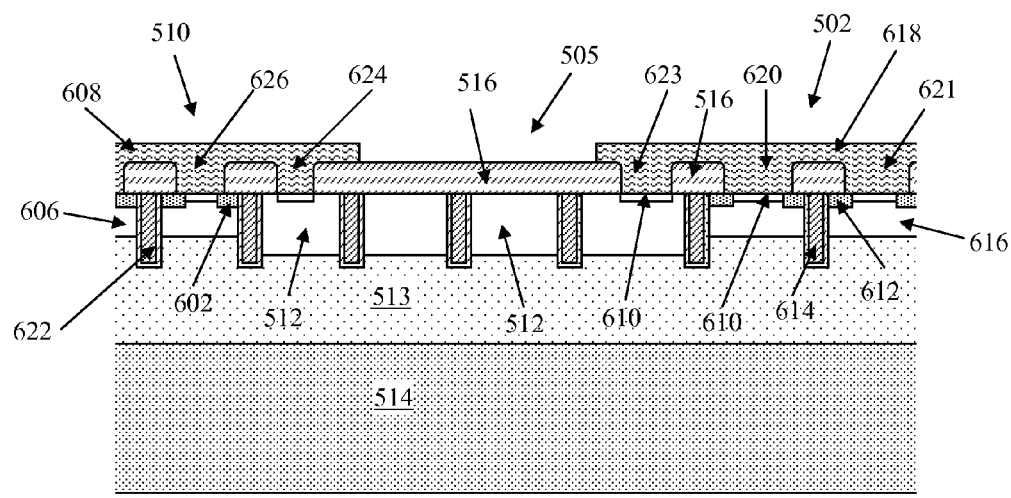
FIG. 6C (B-B'cross-section)

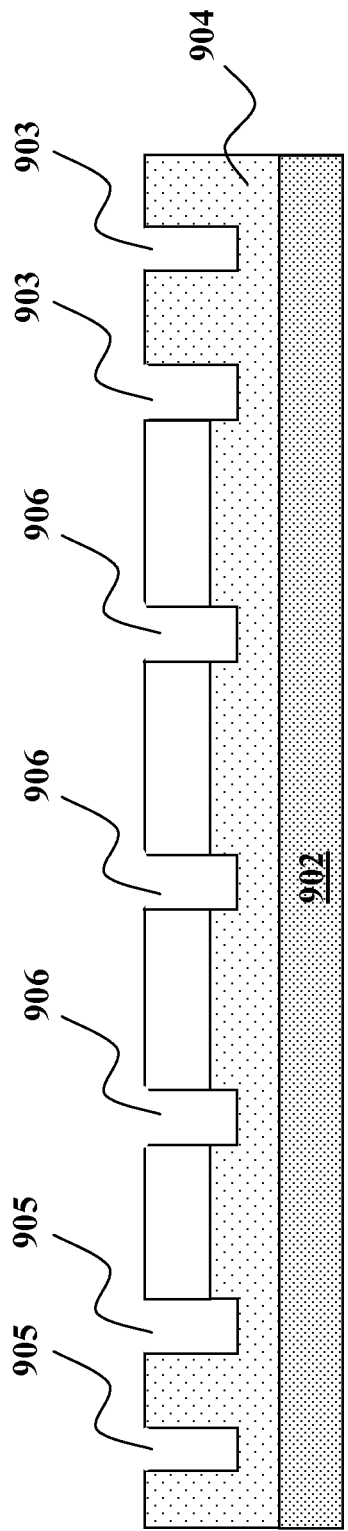
FIG. 10B-B'
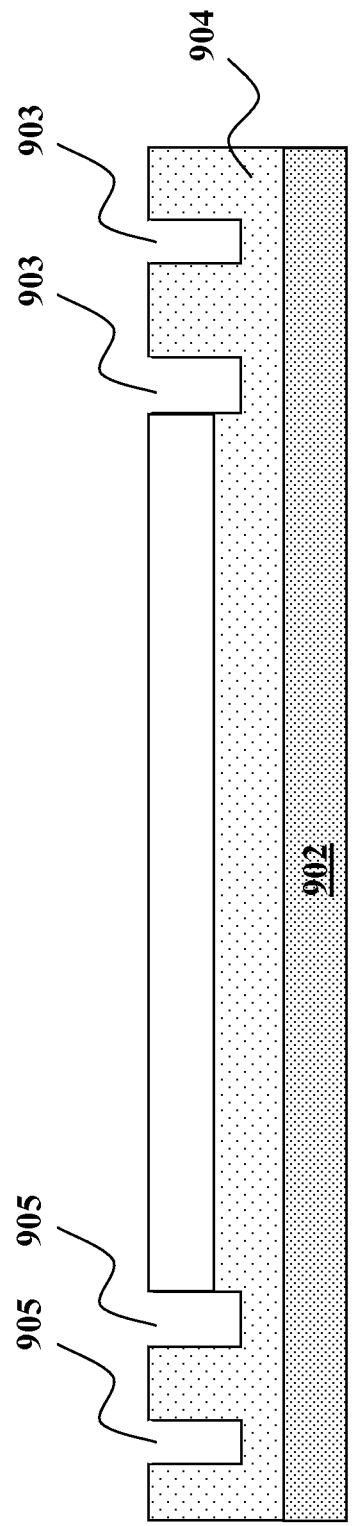
FIG. 10C-C'

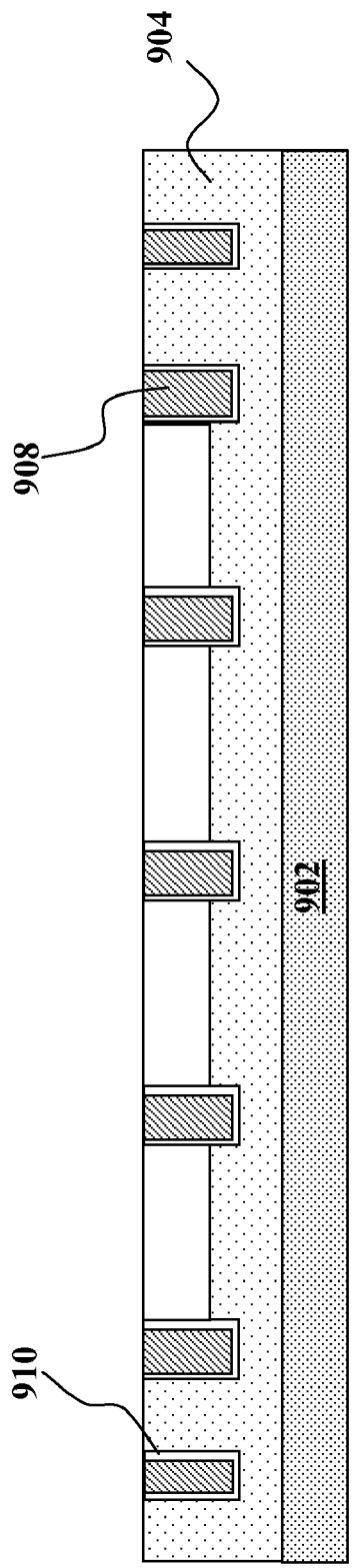
FIG. 11B-B'
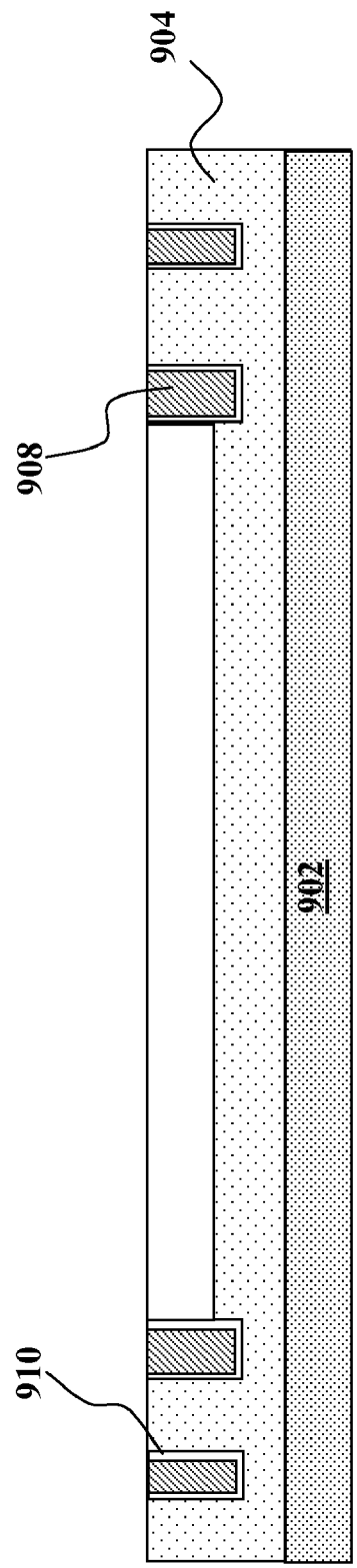
FIG. 11C-C'

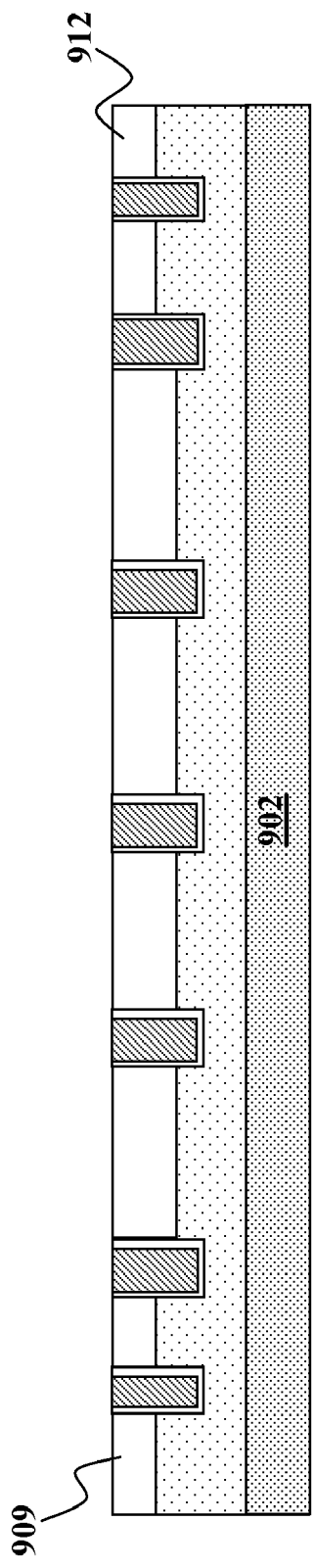
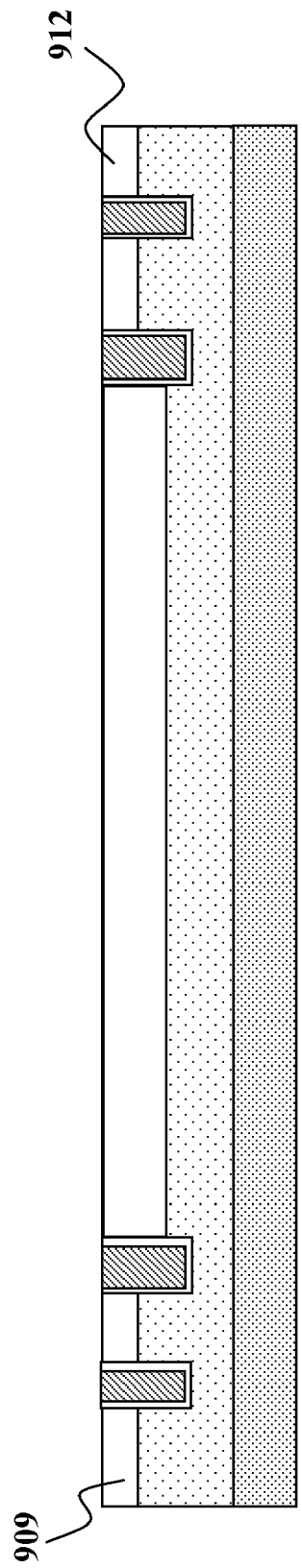
FIG. 12B-B'
FIG. 12C-C'

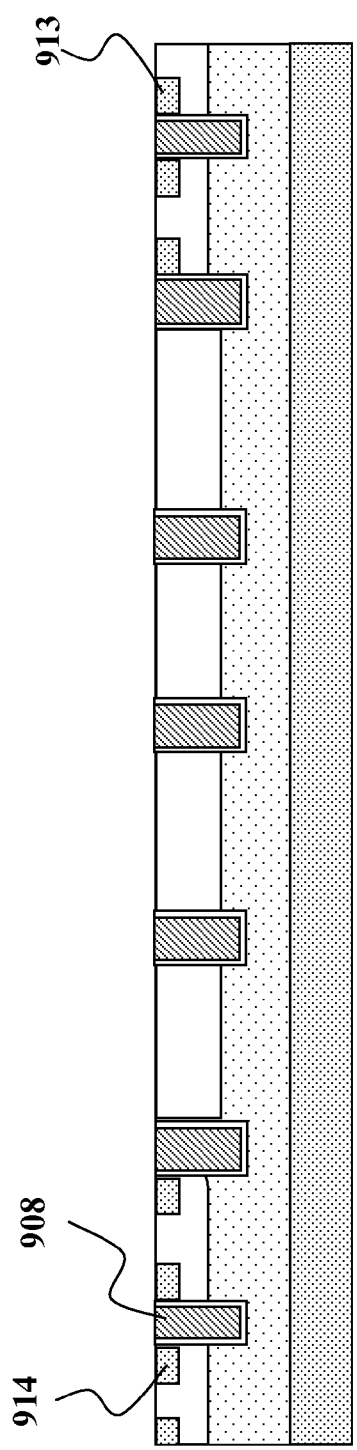
FIG. 13B-B'
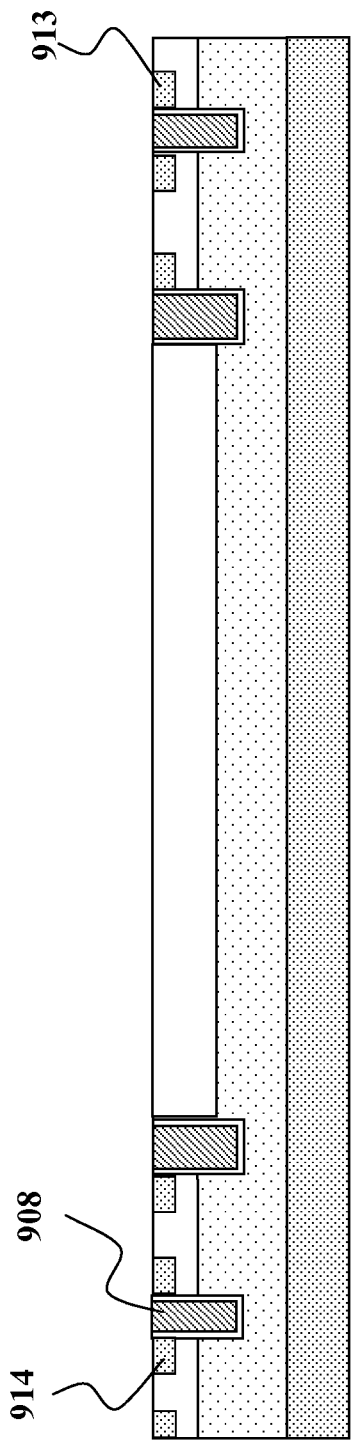
FIG. 13C-C'

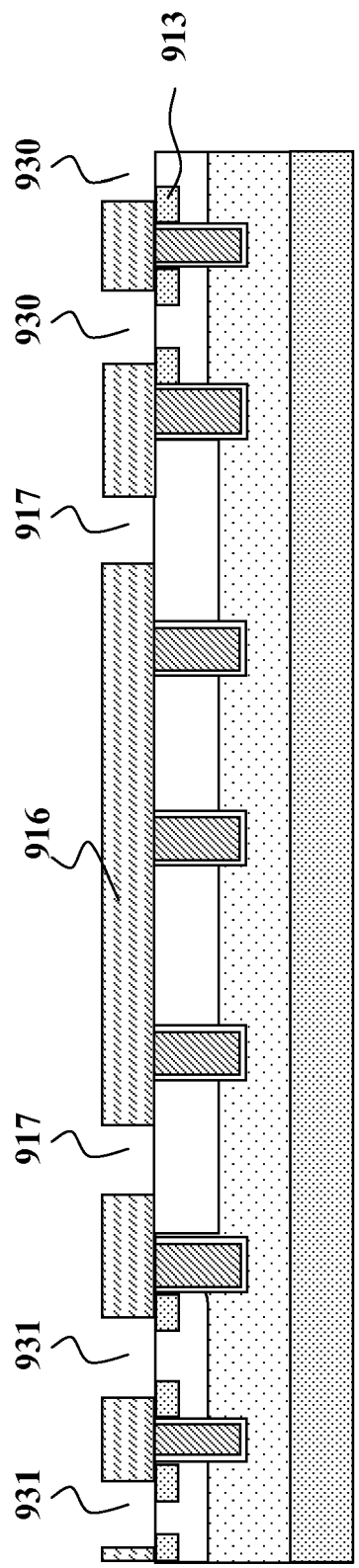
FIG. 14B-B'
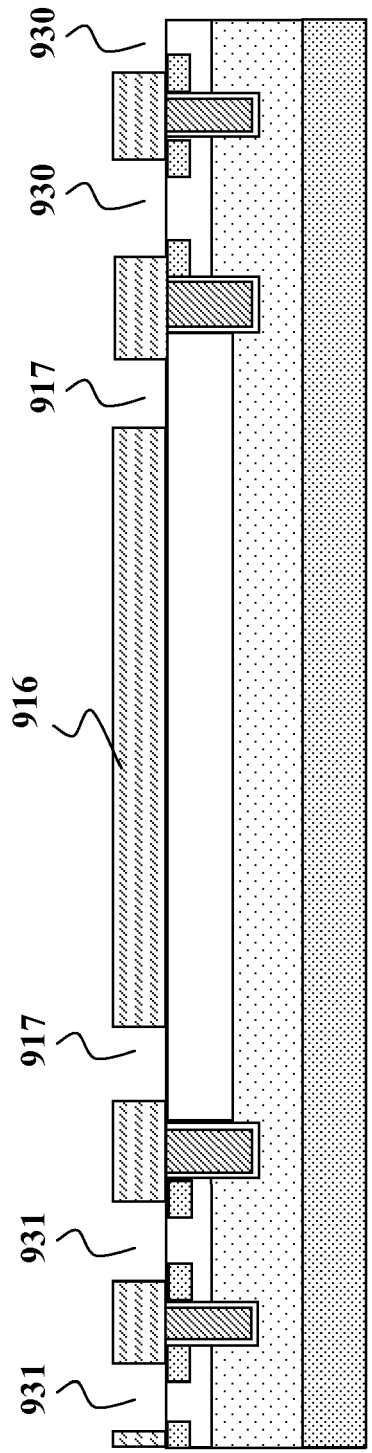
FIG. 14C-C'

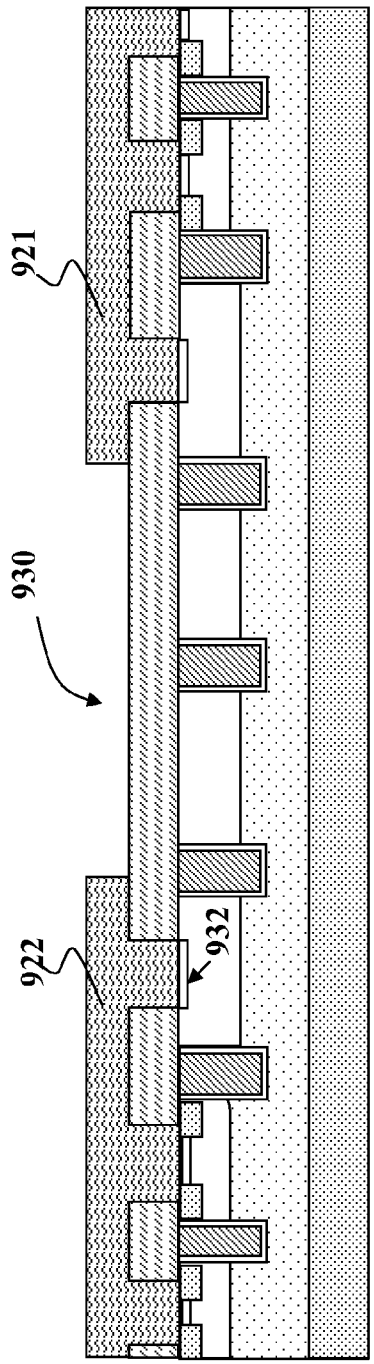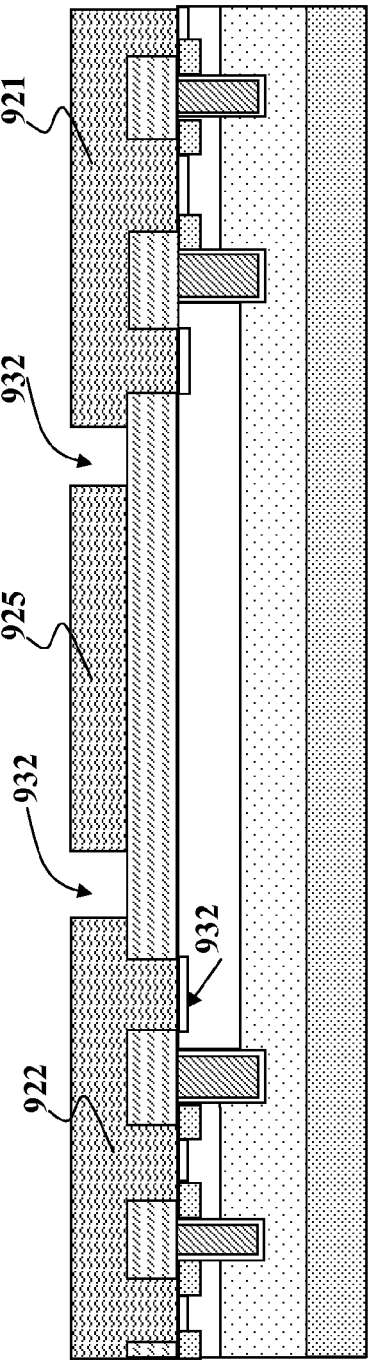
FIG. 15B-B'
FIG. 15C-C'

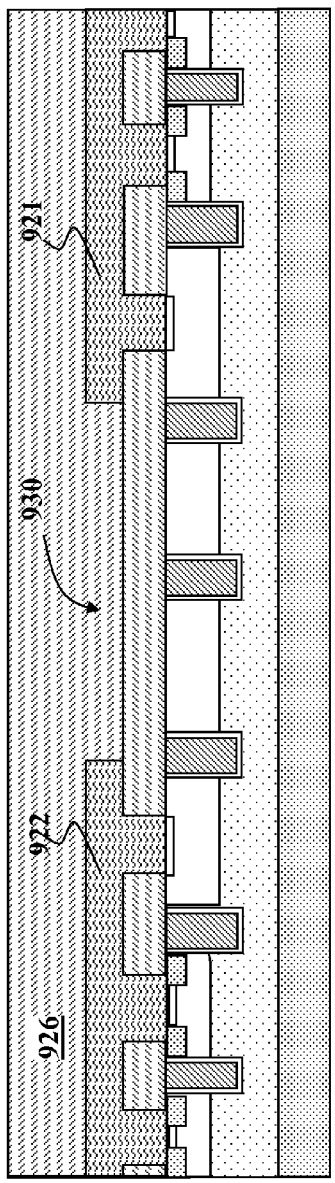
FIG. 16B-B'
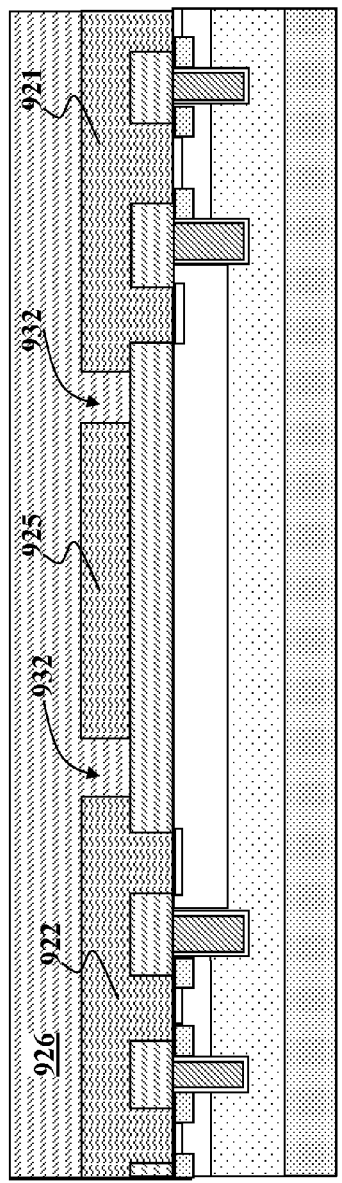
FIG. 16C-C'

INTEGRATION OF SENSE FET INTO DISCRETE POWER MOSFET

CROSS-REFERENCE TO RELATED APPLICATION

This application is a continuation-in-part of and claims the priority benefit of prior U.S. patent application Ser. No. 12/098,970, filed Apr. 7, 2008, the entire contents of which are incorporated herein by reference.

FIELD OF THE INVENTION

Embodiments of this invention generally relate to semiconductor devices and more particularly to semiconductor devices including a power MOSFET and one or more sense MOSFETs with common gate and drain terminals and separate source terminals.

BACKGROUND OF THE INVENTION

One method for determining the current through a load in a circuit is to use a metal oxide semiconductor field effect transistor (MOSFET) for current sensing. Current sensing power MOSFETs conventionally include several thousand transistor cells arranged in parallel and sharing common drain, source and gate electrodes. Each transistor cell or element within the device is identical and current applied at the drain terminal of the device is shared equally between them. In such designs, it is common that the source electrodes of several of the transistors are separated from the remaining source electrodes and connected to a separate source terminal. Accordingly, the resulting current sensing MOSFETs can be thought of as equivalent to two or more transistors in parallel having common gate and drain terminals, but separate source terminals. The first of these transistors, including the majority of the transistor cells in the current sensing power MOSFET, is commonly referred to as the main FET. The second, including the several transistor cells having a separate source terminal, is referred to as the sense FET.

In use, the sense FET conducts only a small fraction of current applied to the common drain terminal, the fraction being inversely proportional to a sense ratio, n, which is a current ratio dependent on the ratio of the number of transistor cells in the main FET to those in the sense FET. The sense ratio n is defined for a condition in which the source terminals of the sense and main FETs are held at the same potential. When the sense ratio is known, the total current flowing through the device, and therefore the load current of a load to which the device is connected, can be calculated from a measurement of the source current of the sense FET, i.e. the current flowing in the current path of the sense FET, between the drain and source electrodes.

U.S. Pat. No. 5,079,456 discloses method and apparatus for measuring and/or controlling the level of current in a Sense FET which includes a power transistor and a sense transistor. Both transistors are biased to operate in a linear mode, and the source-drain voltage $V_{ds}$ of the sense transistor is compared to a predetermined fraction of the $V_{ds}$ of the power transistor. A control signal is generated that is representative of the results of the comparison, and, in one embodiment, that control signal is used in a feedback arrangement to drive the $V_{ds}$ of the sense transistor to the predetermined fraction of the $V_{ds}$ of the power transistor. Consequently, the level of current carried by the sense transistor is caused to be equal to the same predetermined fraction of the current carried by the power transistor.

U.S. Pat. No. 5,408,141 discloses an integrated power device comprising a power transistor and five of sense transistors. Four of the sense transistors are proportionate in size to the power transistor and are constructed around the periphery of the active area occupied by power transistor using the same process that are used to construct the components of the power transistor. The fifth sense transistor is located within the interior of the active area occupied by power transistor and contact is made to the necessary source region of the fifth senses transistor using a second level of metal interconnect to form a source contact.

U.S. Pat. No. 5,962,912 discloses a power semiconductor component having a cell structure includes a metallic resistance track that is insulated from the semiconductor body of the power semiconductor component and from a control electrode by a non-conductive layer. The resistance track is provided in a lateral region between cells of the power semiconductor. The active area of the component is not made smaller by the presence of the resistance track and the resistance track is produced simultaneously with a metallic layer of the component which provides electrical contact with a main electrode of the power semiconductor so that no additional manufacturing steps are required for adding the resistive track.

However, the wire bonding between the sense FET and the main FET will affect the performance of the device. Furthermore, it would be desirable to develop a power device integrating one or multiple sense FETs into one discrete power MOSFET, in a manner which does not increase number of mask layers and manufacturing process sequences. It is within this context that embodiments of the present invention arise.

BRIEF DESCRIPTION OF THE DRAWINGS

Objects and advantages of the invention will become apparent upon reading the following detailed description and upon reference to the accompanying drawings in which:

FIG. 6B is a cross-sectional view along a line A-A' of the FIG. 6A.

FIG. 6C is a cross-sectional view along a line B-B' of the FIG. 6A.

FIGS. 9 and 10B-B' through 16B-B' are a series of cross-sectional schematic diagrams illustrating fabrication of a semiconductor device of the type depicted in FIGS. 5A-5B and 6C along the line B-B'.

FIGS. 9A and 10C-C' through 16C-C'are a series of cross-sectional schematic diagrams illustrating fabrication of a semiconductor device of the type depicted in FIGS. 5A-5B and 7 along the line C-C'.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1:
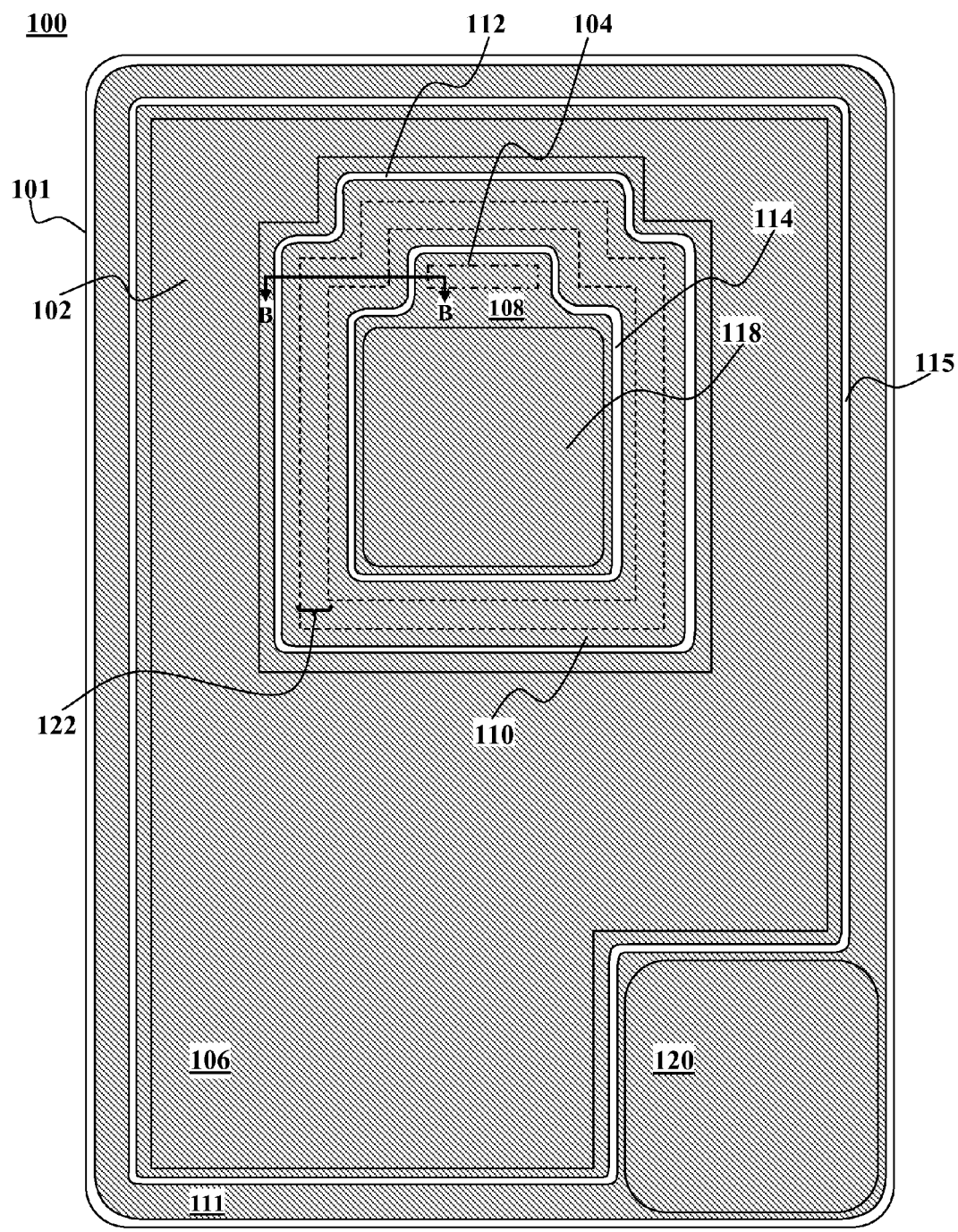
FIG. 1 is a top plan view showing a top view of the semiconductor device according to an embodiment of the present invention.
Figure 1A:
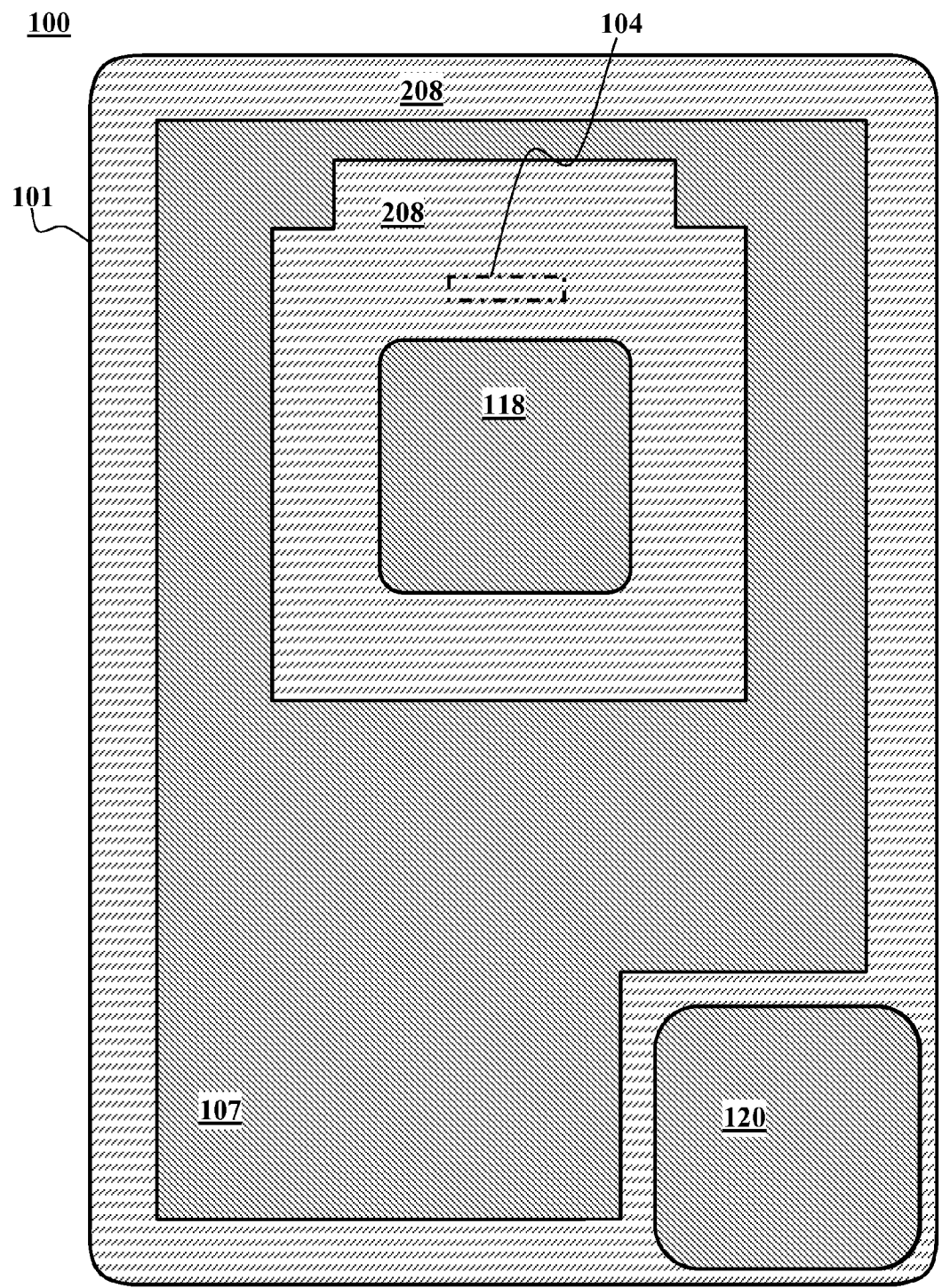
FIG. 1A is a top plan view showing a top view of the semiconductor device showing the passivation layer according to an embodiment of the present invention.
Figure 2:
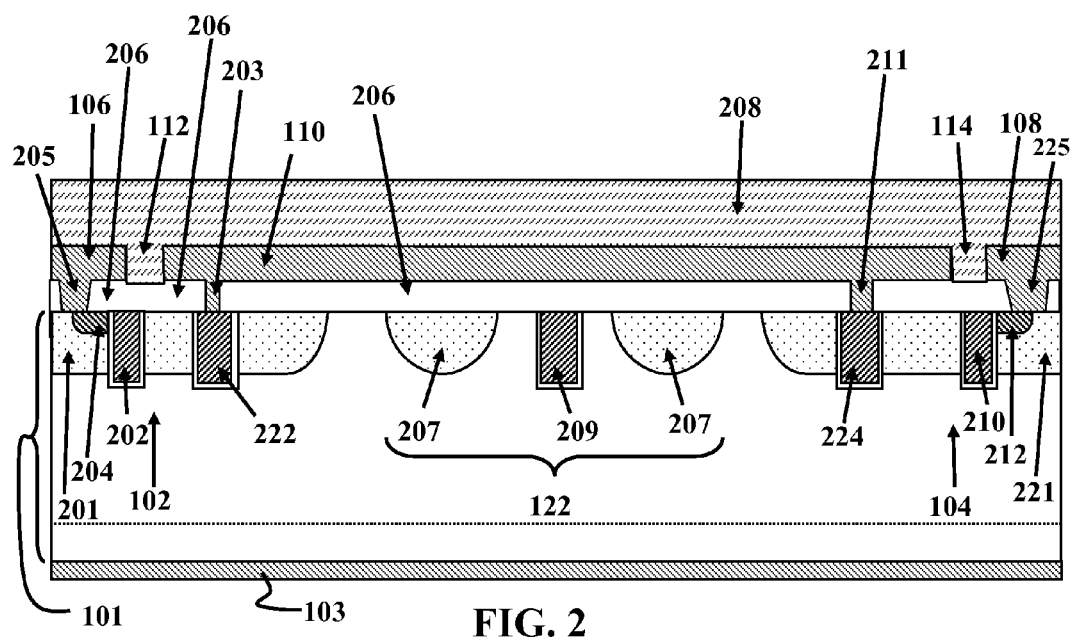
FIG. 2 is a cross-sectional schematic diagram of the semiconductor device of FIG. 1 taken along line B-B.

Certain aspects of embodiments of the invention may be understood by referring simultaneously to FIG. 1, FIG. 1A and FIG. 2. FIG. 1 illustrates a top plan view of a semiconductor device 100 according to an embodiment of the present invention. As shown in FIG. 1, the semiconductor device 100 includes a common substrate 101, a main FET 102, disposed in the common substrate 101, and one or more sense FETs 104, also disposed in the common substrate. As shown in the example depicted in FIG. 1, the sense FET 104 may be built in an area surrounded by active areas of the main FET 102. The main FET 102 may be a metal oxide semiconductor field effect transistor (MOSFET), typically a power MOSFET, and can be arranged as stripe cells or closed cells. The sense FET 104 also can be a metal oxide semiconductor field effect transistor (MOSFET), which can be arranged as stripe cells or closed cells. The main FET 102 and the sense FET 104 are both formed from the common substrate 101. The main FET 102 and sense FET 104 each includes their own source, gate and drain structures. The source structures are formed in a body layer of the common substrate 101. A drain pad 103 (seen in FIG. 2) is formed on a back side of the substrate 101.

The gate and source structures that make up the main FET 102 generally lie underneath the main FET source metal 106. The source structures of the sense FET 104 are electrically connected to a sense FET source metal 108. The gate and source structures that make up the sense FET 104 generally lie under a portion of the sense FET source metal 108. However, these structures generally do not lie underneath the sense FET source pad 118 (sometimes referred to as a sense pad) to avoid damage caused by wire bonding impact. Because the number of sense FET cells is usually in orders of magnitude smaller than the number of the main FET cells, such damage to the sense FET cells would greatly affect the accuracy of designed sense ratio. The main FET cells are also exposed to damage from wire bonding impact, but the number of main FET cells damaged is relatively small compared to the total number of main FET cells, so that does not greatly affect the accuracy of the designed sense ratio. The sense FET source metal 108 may cover the whole sense FET source regions and extend to an area without active sense FET cells 104 where the sense pad may be formed directly on the FET source metal 108 or over a passivation layer over the sense FET source metal 108. The passivation layer is not shown in FIG. 1 for the sake of simplicity. FIG. 1A shows the same top view as FIG. 1, but also shows a passivation layer 208 and the windows opened in the passivation layer 208 to allow bonding to the main FET source metal 106, sense FET source metal 108, and outer gate metal 111 according to one embodiment of the invention. The metal exposed by the windows in the passivation layer 208 in effect form the gate pad 120, the main FET source pad 107, and the sense FET source pad 118. It is clear that the sense FET 104 is not located directly under the sense FET source pad 118.

The gate structures of the main FET 102 and the sense FET 104 are electrically connected to each other by a common gate metal 110. A first metal gap 112 may electrically isolate the main FET source metal 106 from the common gate metal 110. A second metal gap 114 may be located between the common gate metal 110 and the sense FET source metal 108. A third metal gap 115 may be located between the main FET source metal 106 and the outer gate metal 111. Electrical connection between the gate terminals of the main FET 102 and sense FET 104 and the common gate metal 110 may be implemented e.g., by conductor-filled trenches (not shown in FIG. 1) formed in the body of the substrate 101 and electrically isolated from the substrate by a layer of oxide lining the walls of the trenches. These conductor-filled trenches also connect the common gate metal 110 with the outer gate metal 111. The main FET source metal 106, sense FET source metal 108, outer gate metal 111 and common gate metal 110 may be formed from a single patterned metal layer deposited over the substrate 101. The gate pad 120 may be disposed on the outer gate metal 111.

The main FET source metal 106, sense FET source metal 108, outer gate metal 111 and common gate metal 110 may be covered by a passivation layer 208 (seen in FIG. 1A and FIG. 2). External electrical connection to the main FET source metal 106 may be made through vias in the passivation layer 208 to a main FET source pad disposed on the passivation layer 208. Alternatively, the main FET source pad may be formed from a portion of the main FET source metal 106 itself that is exposed through a window in the passivation layer 208. In a similar fashion, external electrical connection to the sense FET source metal 108 may be made through the passivation layer 208 to a sense FET source pad 118 (sense pad) disposed on the passivation layer over the sense FET source metal 108. Alternatively, the sense FET source pad 118 may be formed from a portion of the sense FET source metal 108 which is exposed through a window in the passivation layer 108. It is common for nearly the entire surface of the main FET source metal 106 to be made available for bond wire bonding. In addition, external electrical connection to the gate metal 110 may be made through the passivation layer to a gate pad 120 disposed on the passivation layer over the gate metal 110. However, in the embodiment shown in FIG. 1, FIG. 1A, and FIG. 2 the gate pad 120 is formed from the outer gate metal 111. The common gate metal 110 and the outer gate metal 111 are connected underneath by gate runner trenches 222 (FIG. 2). The drains of the main FET 102 and the sense FET 104 may be electrically connected through the lower portion of the substrate 101 to a common drain pad 103 (seen in FIG. 2), which may be formed on a back side of the common substrate 101.

The semiconductor device 100 also includes an electrical isolator 122 formed in a body layer of the common substrate 101 between the main FET 102 and the sense FET 104 as shown in FIG. 2. In the example depicted in FIG. 1, the electrical isolator 122 is located between the first metal gap 112 and the second metal gap 114. By way of example, the electrical isolator 122 may be implemented in the form of a combination of doped body 207 and trench rings 209. The electrical isolator 122 provides electrical isolation between the source structures of the main FET 102 and the sense FET 104 within the body of the common substrate 101.

As shown in FIG. 2, the main FET 102 may include a plurality of FET structures, each of which includes a trenched gate 202, and a source 204 formed by suitable doping of portions of a body region 201 of the substrate 101. The gate 202 for each main FET device may be in the form of a trench lined with an insulator such as an oxide and filled with conductive polysilicon. The gates 202 may run perpendicular to the B-B cross section and across one or more trench gates running in parallel to the B-B cross section and electrically connected to gate runner trench 222, which makes electrical contact with the common gate metal 110 through an insulating layer 206 by way of one or more conductive vias 203. The gate runner trench 222 also connects to the outer gate metal 111. The source 204 of one main FET cell may be connected in parallel to other such devices by a main FET source metal 106, The source region 204 may make electrical contact to the main FET source metal 106 through an insulating layer 206 by conductive vias 205. The main FET source metal 106 may make electrical contact to the main FET source pad by way of conductive vias formed through portions of the passivation layer 208 that underlies the source pad and overlies the main FET source metal 106. Alternatively, the main FET source pad can be formed from a section of the main FET source metal 106 uncovered by a window in the passivation layer 108. It is common to allow nearly the entire surface of the main FET source metal 106 to be available as bonding area for bond wires.

The sense FET 104 may similarly include a plurality of device structures, each of which may include a trenched gate 210 electrically coupled to gate runner 224 through one or more perpendicular gate trenches. The gate runners 224 are connected to the common gate metal 110 by vias 211. From the common gate metal 110, the gate runners 224 are also electrically connected to the gate pad 120 by way of the outer gate metal 111 and gate runners 222. Sense FET source 212 is electrically coupled to other sense FET cells sources by way of a sense FET source metal 108 through vias 225. The trenched gate 210, source 212 and body region 221 may be configured as described above with respect to the main FET gate 202, source 204 and body 201. The sense FET source metal 108 may make electrical contact to the sense FET source pad (sense pad) 118 through conductive vias formed in the passivation layer 208. Alternatively the sense pad can be formed from a portion of sense FET source metal 108 which is exposed through a window in the passivation layer 208. The common gate metal 110 electrically connects the trenched gate runners 222 of the main FET 102 with the trenched gate runners 224 of the sense FET 104. The first metal gap 112 electrically isolates the main FET source metal 106 from the common gate metal 110, and the second metal gap 114 electrically isolates the sense FET source metal 108 and the common gate metal 110.

As discussed above, the source and body regions of the main FET and sense FET devices are formed in the same substrate 101. The electrical isolator 122 isolates these two source and body regions. By way of example, the electrical isolator 122 may include body implant rings 207 and an electrically isolated and electrically floating poly-filled trench 209 to provide electrical isolation between the main FET 102 and the sense FET 104. The body implant rings 207 may be formed by suitably doping portions of the substrate 101. The trench 209 may have a configuration like that of the trench gates 202, 210, but it is electrically isolated from the trench gates. To electrically isolate the main FET and sense FET source metals 106 and 108, and common gate metal 110, the passivation layer 208 may fill in the metal gaps 112 and 114 and is disposed on top of the main FET source metal 106,
sense FET source metal 108 and the common gate metal 110. Alternatively, a portion or all of passivation layer 208 may be eliminated and bond wire may directly bond to main FET source metal 106, sense FET source metal 108 and the common gate metal 110 respectively.

Figure 3A:
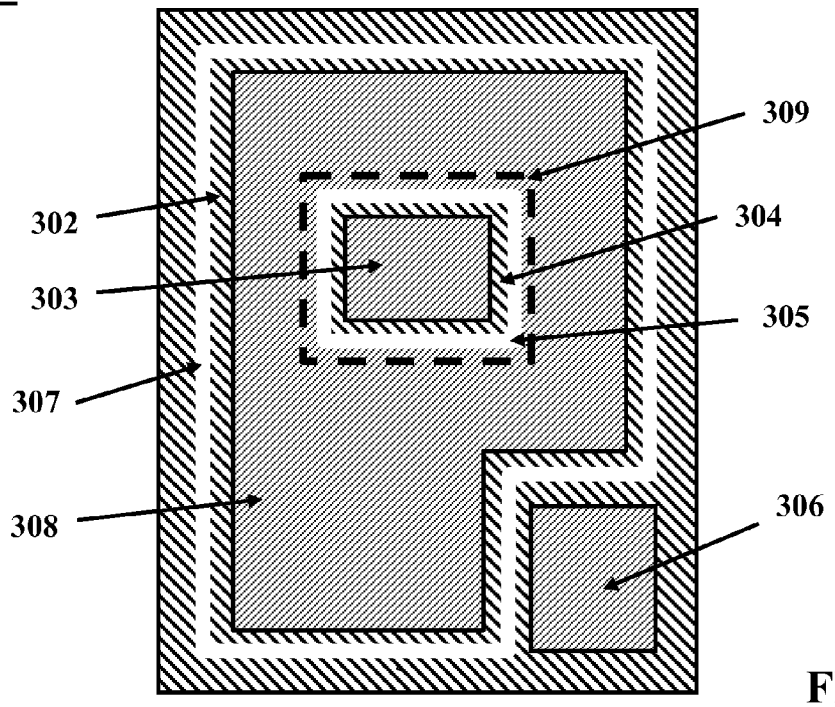
FIGS. 3A-3D are schematic diagrams showing top views of alternative sense FET configurations for a semiconductor device according to an embodiment of the present invention.

There are a number of different possible layouts for semiconductor devices according to embodiments of the present invention. FIGS. 3A-3D are schematic diagrams showing top views of just a few of the many possible alternative sense FET configurations for a semiconductor device according to an embodiment of the present invention. By way of example, a semiconductor device 300 may include a sense FET may be built inside an active area of the main FET, as shown in FIG. 3A. The semiconductor device 300 includes a sense FET 304 located proximate the center of the main FET 302. Source metal for the main FET 302 and sense FET 304 lies between the FETS and corresponding source pads 303 and 308, and a gate pad 306. Gaps 305, 307 are formed in a common metal layer to divide it into a gate metal region and source metal regions for the main FET 302 and the sense FET 304. The source pads 303, 308 for the main FET and sense FET overlie the corresponding metal regions. The gate pad 306 overlies a portion of the gate metal region. An electrical isolator 309 indicated by the dashed line may be formed in a body portion of the substrate in a suitable pattern to electrically isolate the source regions of the main FET 302 and sense FETS 304.

Figure 3B:
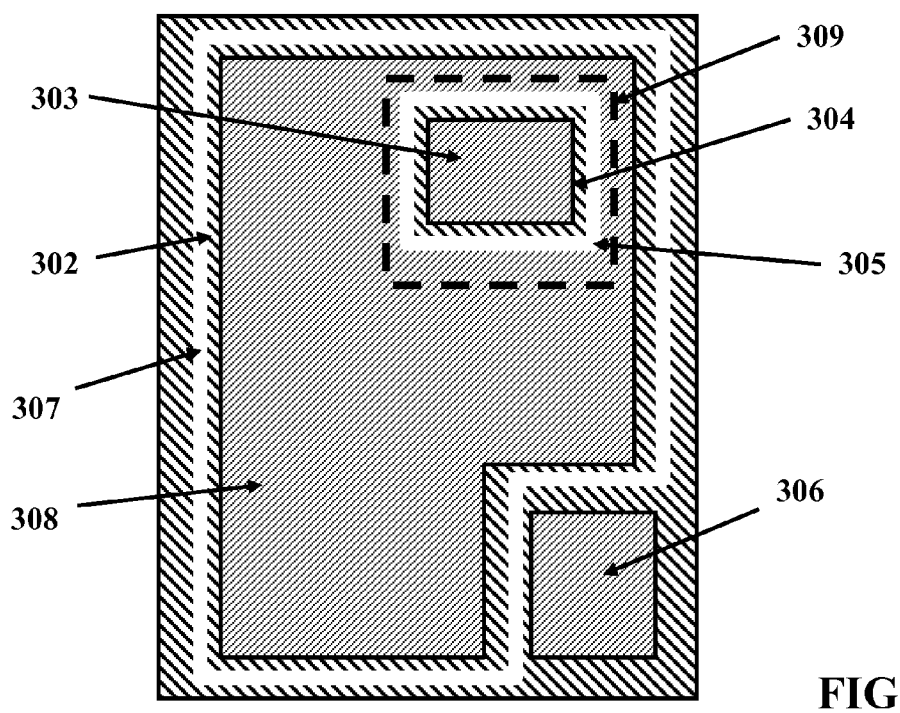
Figure 3C:
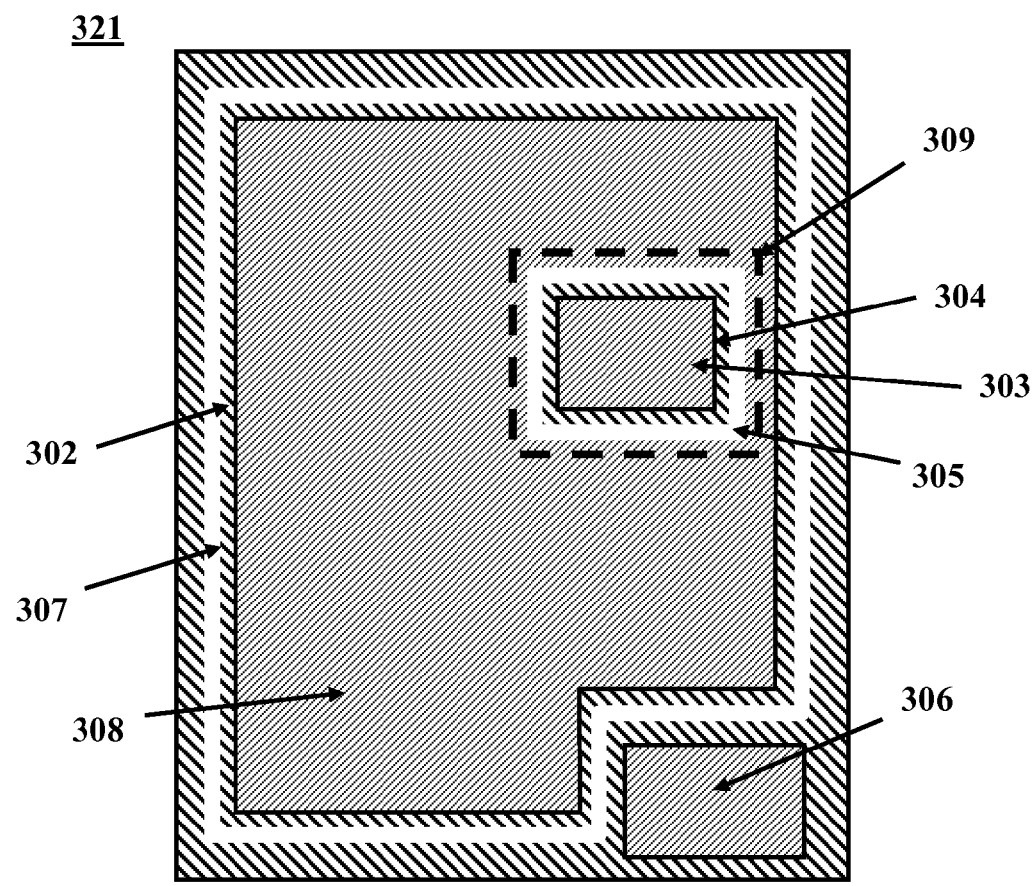

The sense FET 304 may be located proximate a corner of the main FET 302 as shown in the semiconductor device 301 of FIG. 3B. Alternatively, the sense FET 304 may be located proximate an edge of the main FET 302 as shown in the semiconductor 321 of FIG. 3C. Current ratio between main FET and sense FET may be adjusted by changing only one source mask layer.

Figure 3D:
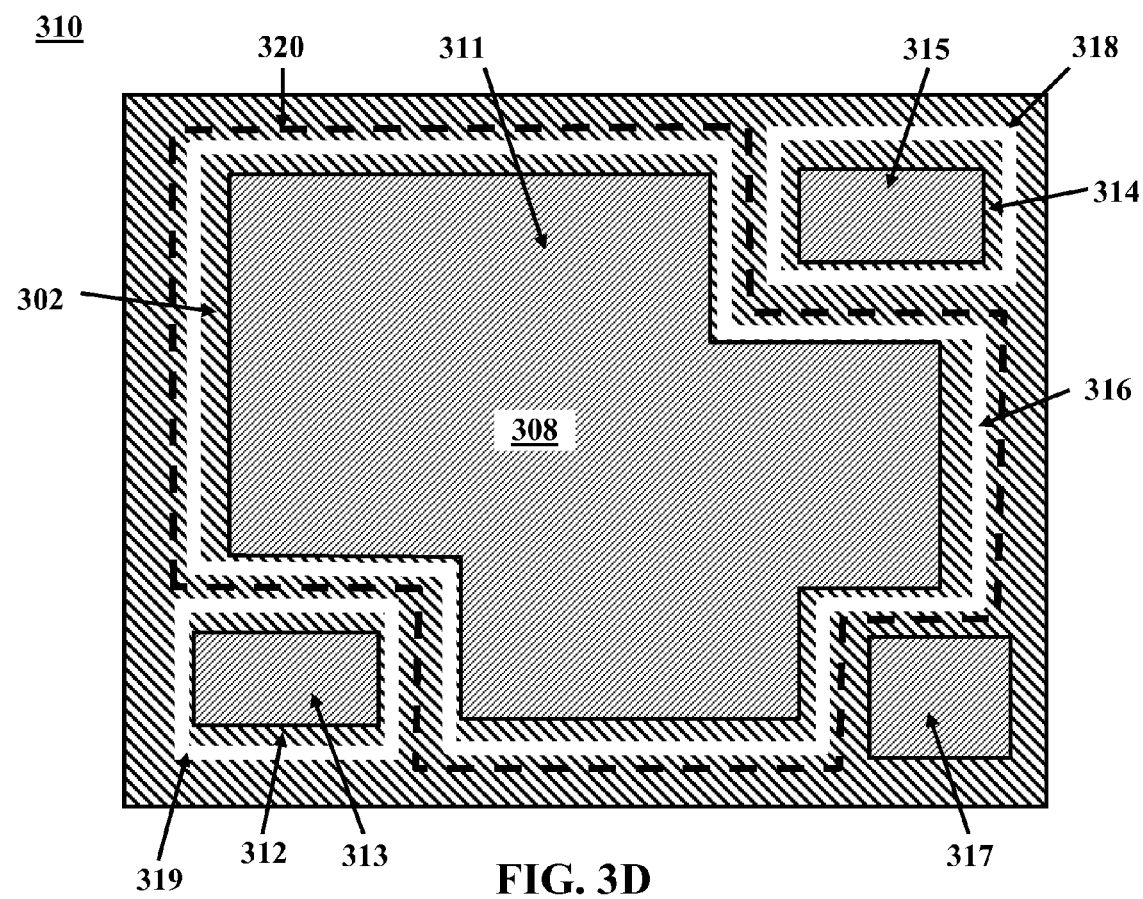

Multiple Sense FETs with a number of different current ratios may be easily integrated into main power MOSFET. FIG. 3D is showing a semiconductor device 310 including two sense FETs 312 and 314 located proximate corners of the main FET 302. Source metal for the main FET and two sense FETs lies between the FETs and corresponding source pads 311, 313, 315 and a gate pad 317. Gaps 316, 318, 319 are formed in a common metal layer to divide it into a gate metal region and source metal regions for the main FET and each sense FET. The source pads 311, 313, 315 for the main FET and sense FETS overlie the corresponding metal regions. The gate pad 317 overlies a portion of the gate metal region. An electrical isolator 320 indicated by the dashed line may be formed in a body portion of the substrate in a suitable pattern to electrically isolate the source regions of the main FET and sense FETS.

Figure 4A:
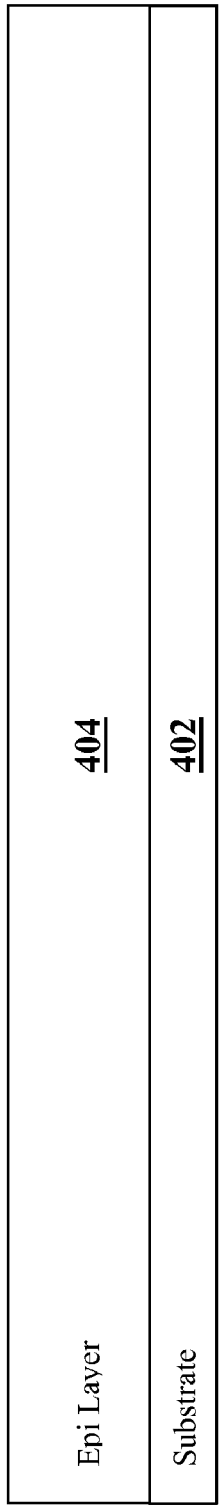
FIGS. 4A-4H are a series of cross-sectional schematic diagrams illustrating fabrication of a semiconductor device according to an embodiment of the present invention.
Figure 4B:
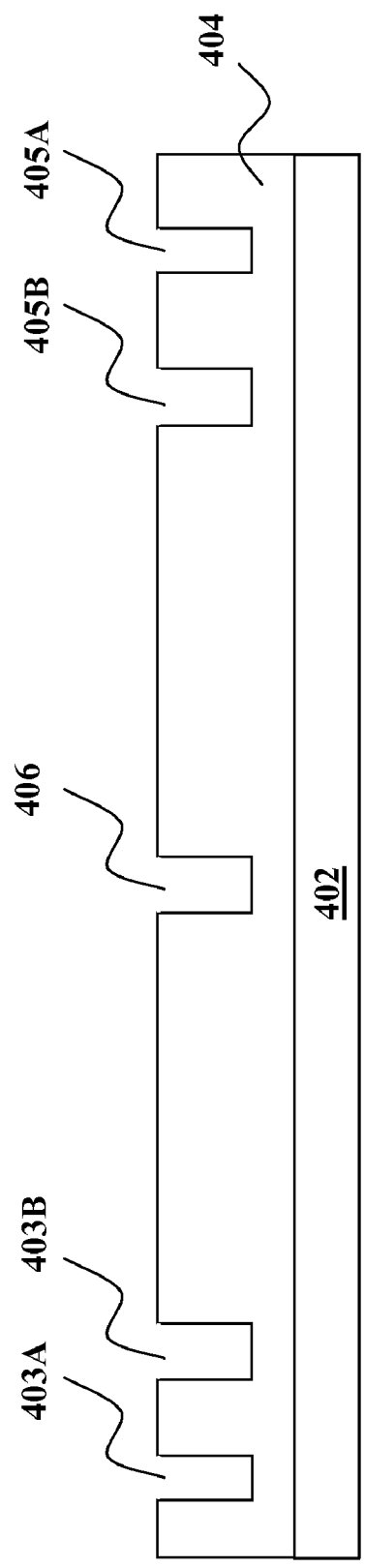
Figure 4C:
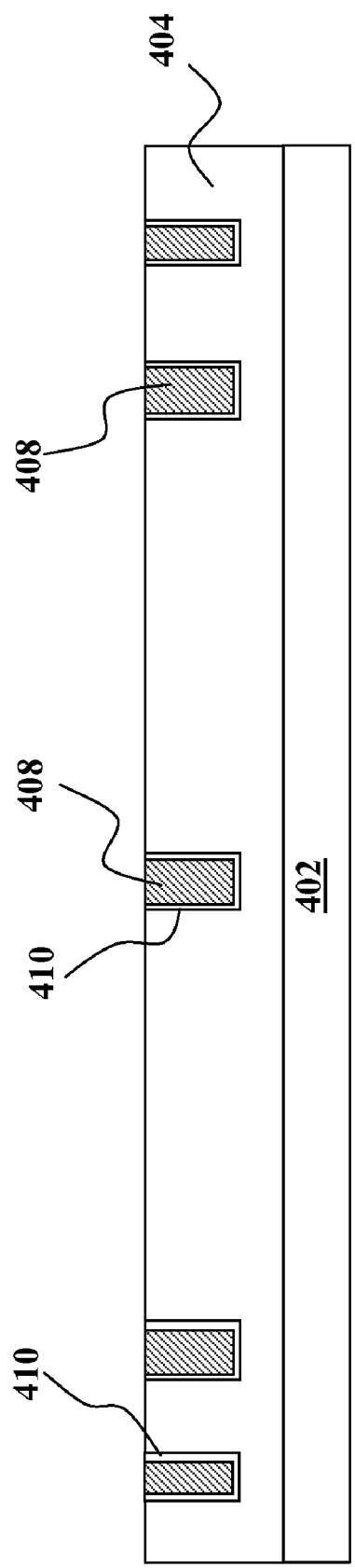

There are a number of different possible ways of fabricating semiconductor devices of the types discussed above. By way of example, FIGS. 4A-4H are a series of cross-sectional schematic diagrams illustrating fabrication of an N-channel MOSFET semiconductor device according to an embodiment of the present invention. A similar technique may be used to fabricate a P-channel MOSFET device. As shown in FIG. 4A, an N-epi layer 404 may be formed on top of an N+ substrate 402. A trench mask (not shown) is then formed on top of the N-epi layer 404. The N-epi layer 404 may be etched through the trench mask to a predetermined depth to form main FET gate trench 403A, main FET gate runner trench 403B, sense FET gate trench 405A, and sense FET gate runner trench 405B and isolation trench 406 as shown in FIG. 4B. Gate oxide 410 may then be grown on the sidewall of the trenches 403A, 403B, 405A, 405B and 406. The trenches 403, 405 and 406 may then be filled with a conductive material 408, such as polysilicon, and then etched back as shown in FIG. 4C. In this manner, source terminals, trench gates and isolation trenches may all be formed simultaneously in a common sequence of process steps.

Figure 4D:
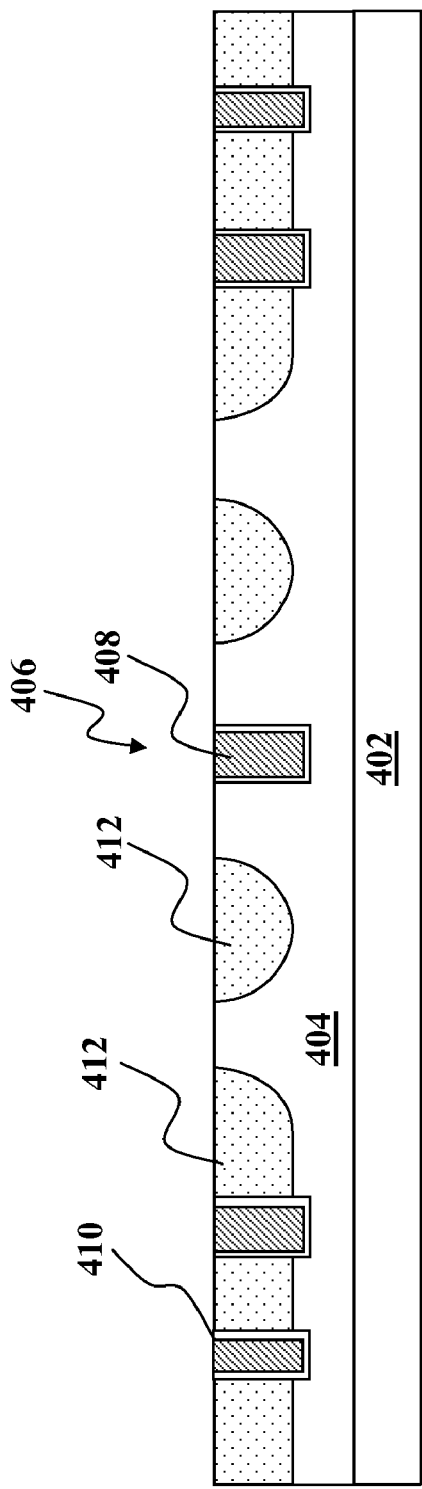
Figure 4E:
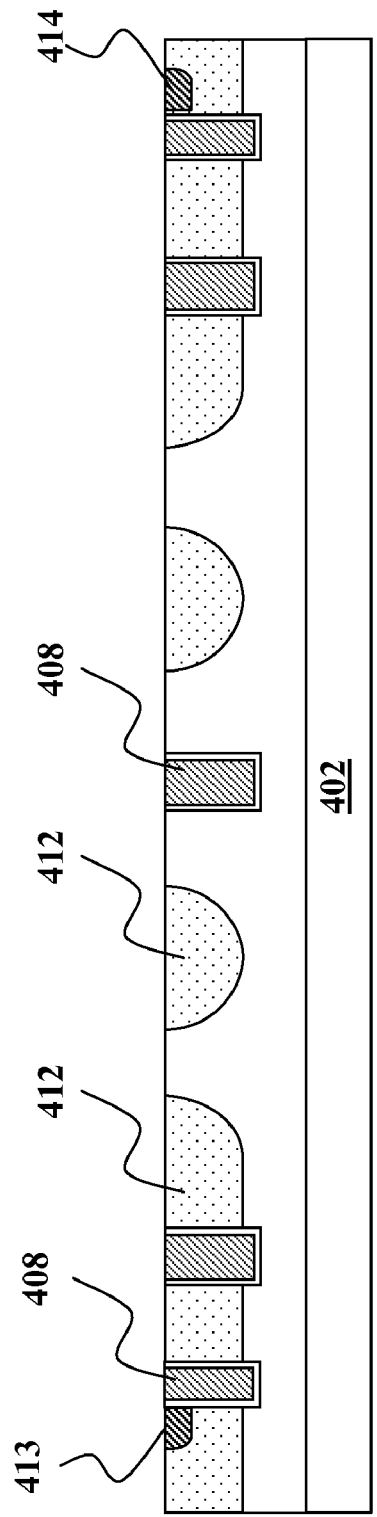
Figure 4F:
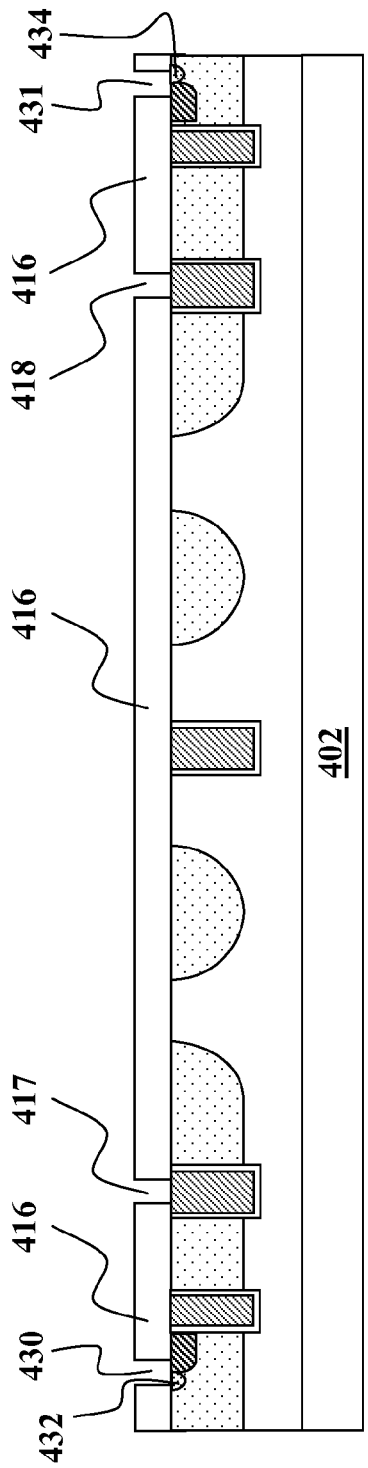

To form source regions and an electrical isolator, the epitaxial layer 404 may be implanted with dopants of an opposite polarity (i.e., conductivity type) to the doping of the epitaxial layer. By way of example, with a body mask (not shown), P-type dopants 412 may be implanted and annealed in the N-epi layer 404 proximate the main FET gate trench 403A, main gate runner trench 403B, sense FET gate trench 405A, sense FET gate runner trench 405B, and the isolation trench 406. The P-type dopants 412 proximate the isolation trench 406 form body rings that help provide electrical isolation between the main FET and the sense FET as shown in FIG. 4D. In this manner the main FET and sense FET device regions as well as the body block rings may all be formed simultaneously in a common sequence of process steps. It is noted that in this example to fabricate an N-channel device, P-type dopants are implanted in the N-type doped epitaxial layer 404. Alternatively, N-type dopants may be implanted in a P-type doped epitaxial layer for fabrication of a P-channel device. N+ type dopants are implanted and annealed to form a main FET source region 413 and the sense FET source region 414 as shown in FIG. 4E. An insulating layer 416, e.g., borophosphosilicate glass (BPSG), is depositing on top of the N-epi layer 404. The insulating layer 416 is etched back to form contact openings 417 and 418 located on top of the main FET gate runner trench 403B and sense FET gate runner trench 405B respectively; and to form contact opening 430 and 431 for the main FET source and sense FET source, respectively as shown in FIG. 4F. Contact implants 432, 434 can be implanted through the contact openings 430 and 431.

Figure 4G:
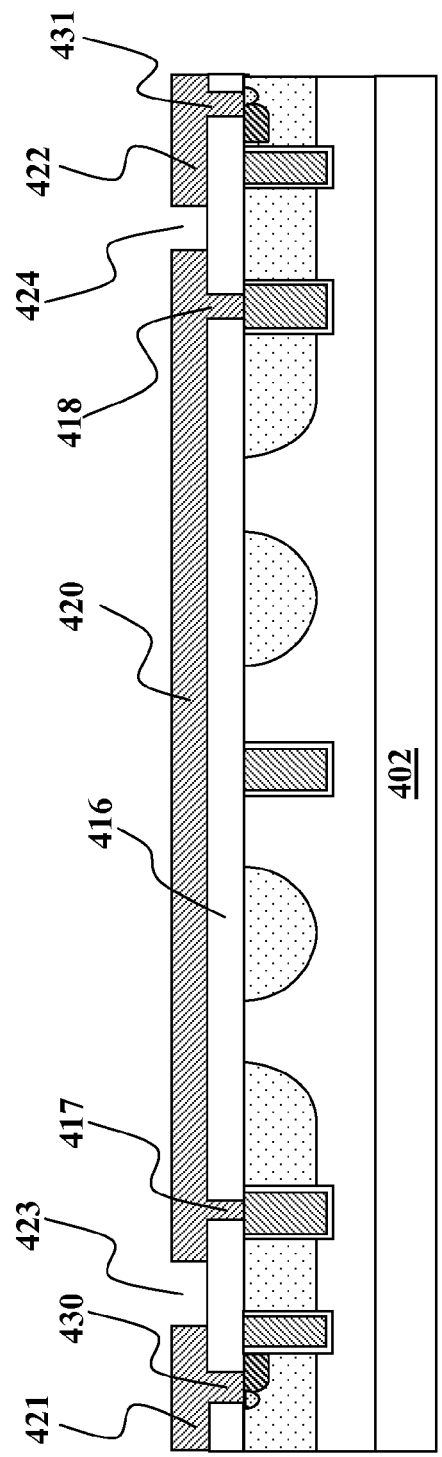
Figure 4H:
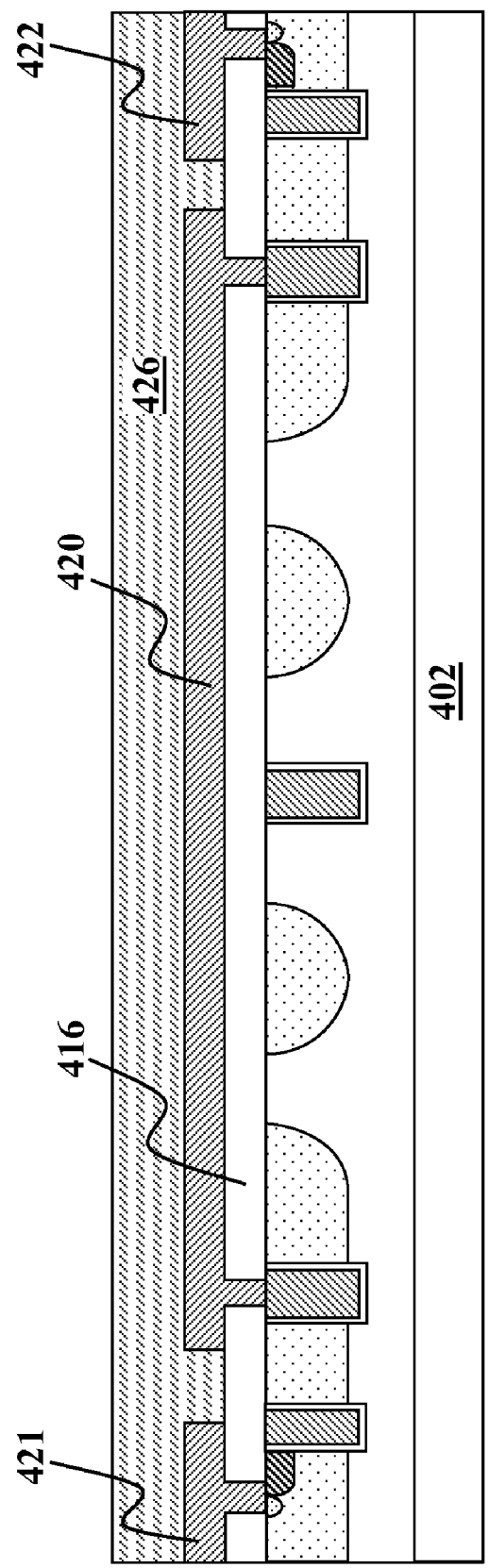

A conductive layer is deposited on top of the insulating layer 416 and into contact openings 417, 418, 430 and 431 and patterned to form a common gate metal 420 (which is electrically connected to the main FET gate runner trench 403B and the sense FET gate runner trench 405B), a main FET source metal 421 and a sense FET source metal 422. The conductive layer may be etched back to form opening 423 for isolation between the common gate metal 420 and the main FET source metal 421, and opening 424 for isolation between the common gate metal 420 and the sense FET source metal 422 as shown in FIG. 4G. A passivation layer 426 is finally deposited into the openings 423, 424 and deposited on top of the common gate metal 420, main FET source metal 421 and sense FET source metal 422 as shown in FIG. 4H.

The method described above in FIGS. 4A-4H only shows the making of an N-channel main FET and a sense FET on a common substrate with the sense FET not being located under the sense FET source pad. However, multiple sense FETs with a number of different current ratio can be easily formed on a common substrate with main FET using this method without additional manufacturing process and additional mask layers required. Embodiments of the present invention allow the main FET, the sense FET and the electrical isolation between them to be formed from the same semiconductor substrate using common process steps. Although the nature and sequence of the steps used in fabricating devices according to embodiments of the present invention may be common, the masks used during the process steps are different in that they provide for fabrication of the electrical isolation as well as the FET devices.

According to an alternative embodiment of the present invention, a sense FET probe can be formed at the center of the main FET, which results in a more accurate and consistent current ratio with the main FET due to less current spreading around the probe. This current ratio is a key parameter for current regulation. The sense FET probe is connected through a sense pad which is located at the die edge of a discrete power MOSFET. This integration requires no additional mask layer, and no additional manufacturing process. The integrated sense FET probe will share the same gate terminal, the same drain terminal, but separate source terminal from the main FET.

As shown in FIGS. 5A-5B and FIGS. 6A-6C, a semiconductor device 500 can have a similar structure as the semiconductor device 300 of FIG. 3A, except that a sense FET probe is located at the center of the main FET, away from the sense FET source pad. The semiconductor device 500 includes a main FET 502 located on top a semiconductor die 501 and a sense FET probe 510 is located at a center of the main FET 502. The sense FET probe 510 includes one or more sense FET structures formed amongst the FET structures that make up the main FET. A sense FET source pad 503 is located proximate an edge of the semiconductor device 500, away from the sense FET probe 510. The sense FET probe 510 is connected to the sense FET source pad 503 by a conductive finger 511, which is sometimes referred to herein as a sense FET probe metal or sense FET antenna. The sense FET probe metal 511 can be made from same metal layer as main FET source metal 508 and gate metal 509. Preferably, the sense FET probe metal 511 is made of a highly conductive material such as copper or aluminum and is sufficiently wide so that the conductive finger is not a resistor. It is desirable that the sense FET 510 (which lies underneath the probe metal 511) is not wider or longer than the probe metal 511 is. Preferably the sense FET source pad 503 is located on a periphery of the device 500 and is spaced apart from a location of the sense FET. The transistor portion of the sense FET 510 is substantially surrounded by and proximate to the main FET transistors for minimal measurement distortion and variation.

The sense FET probe 510, conductive finger 511, and the sense FET source pad 503 are electrically isolated from the main FET 502 by a gap 505 and an underlying electrical isolation structure, which may be similar to the electrical isolator 122 described above, with respect to FIG. 2, with doped body rings and an isolation trench. The gap 505 and isolation structure surround the sense FET probe 510. By way of example, the semiconductor device 500 may be a discrete vertical power MOSFET. The main FET 502 comprises of many transistors working in parallel with a shared gate signal, to function as a single discrete power MOSFET, as opposed to an integrated circuit (IC) chip which has many transistors not connected in parallel, with different gate signals.

An electrical isolator, such as the electrical isolator 122 as described above in FIG. 2, or regions with gate trenches without source implant, or deep well implant 512, may be formed in a top portion of the substrate in a suitable pattern to electrically isolate the source and body regions of the main FET 502 from source and body regions of the sense FET probe 510. Deep wells 512 may have the same conductivity type as the main FET body regions, but have a lower doping concentration, e.g. about $4 \times 10^{16}/cm^3$. Deep wells are also deeper than the main FET body regions, but not deeper than the gate trenches, e.g., about 1-2 microns (µm) deep, or more specifically between 1.4 and 2 microns (or about 1.7 µm). For reference, a typical body region depth may be about 0.5 to 0.7 µm deep. The deep well isolation may be a couple of cell pitches wide, e.g., 2 to 10 µm wide. The width of the deep well isolation can be as small as a single cell pitch. It is dependent on the process capability of the fabrication facility (fab). The sense FET source metal 608 and the main FET source metal 618 must not short out or bridge, so there must be enough of a gap between the two to allow for this, and the size of gap depends on the process capability of the fab.

Figure 6A:
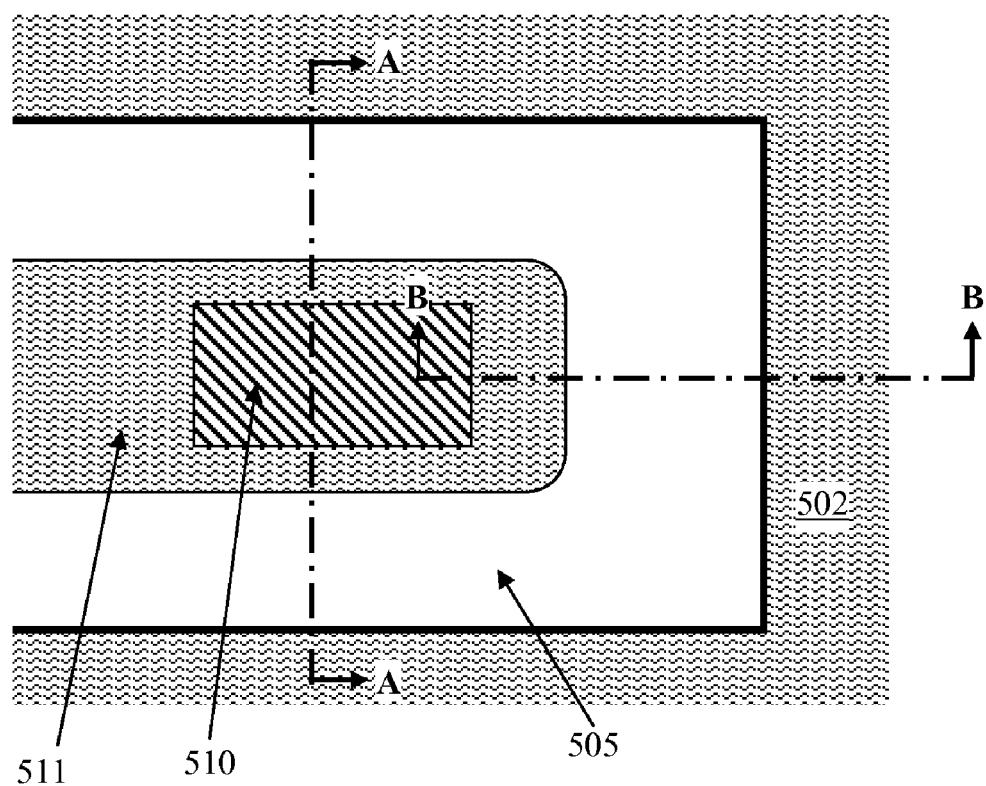
FIG. 6A is a schematic diagram showing a top view of the sense FET probe described in FIGS. 5A-5B.

The isolation structure around the sense FET also terminates the active area voltage so that the sense FET probe 510, conductive finger 511, and sense FET source pad 503 lie "outside" of the main FET active area due to the gap 505, and the isolation structure, which extend from the edge of the active area. However the sense FET probe 510 and conductive finger 511 allow the sense FET probe 510 to be located amidst the main FET 502 transistors with minimal distortion. The sense FET source pad 503, conductive finger 511, and sense FET probe source metal 608 may be formed from the same metal layer as the gate metal 509 and main FET source metal 508. Note that the conductive finger 511 is not a resistive element. By way of example, it can be made at least as wide as the sense FET, as shown in FIG. 6A.

A gap 507 is formed in a common metal layer to separate gate metal 509 and main FET source metal 508 for the main FET 502. The gate pad 506 overlies a portion of the gate metal 509. A drain terminal (not shown) is located at the bottom of the semiconductor substrate and is used by both the main FET 502 and the sense FET 510.

Figure 5A:
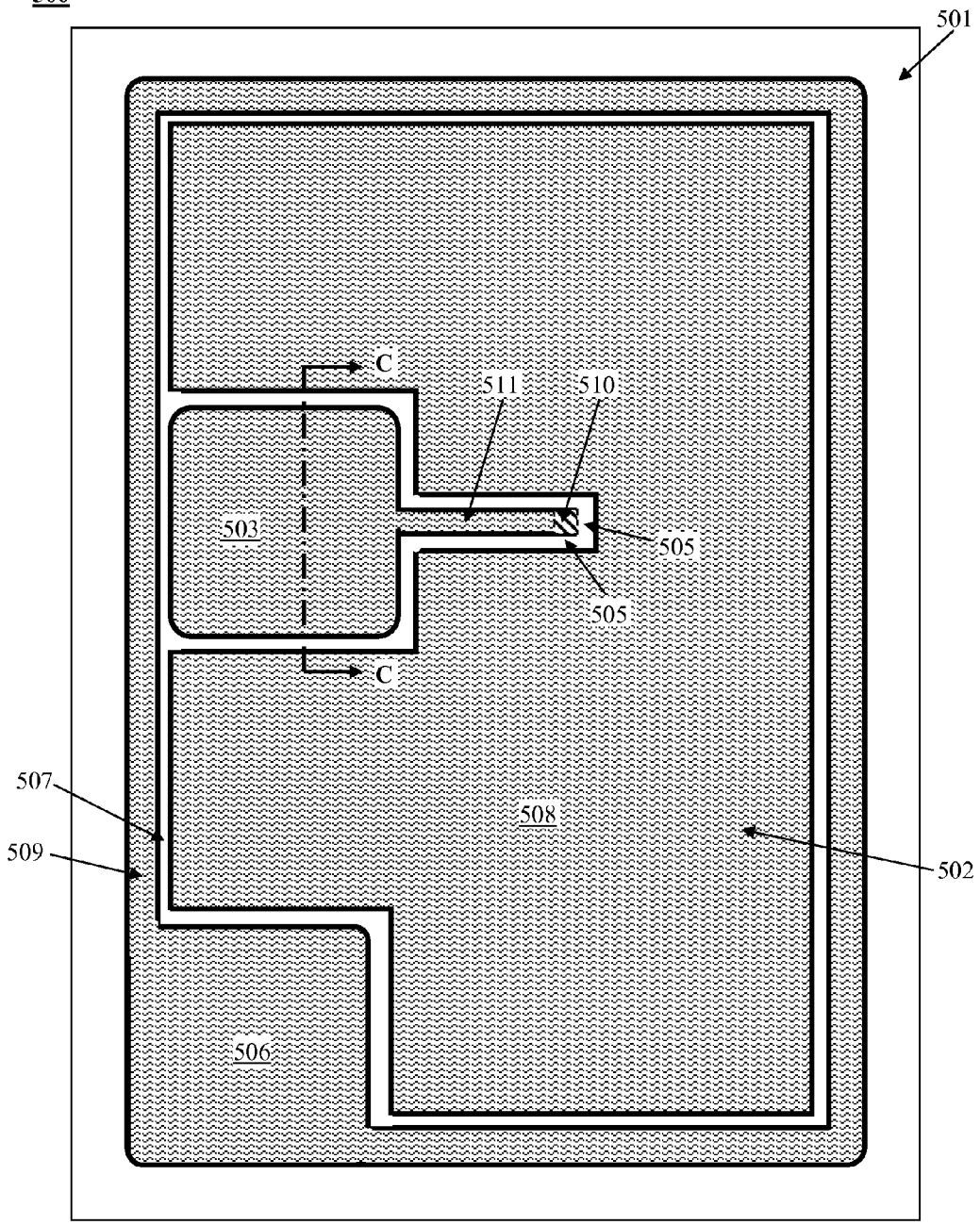
FIG. 5A is a schematic diagram showing a top view of a semiconductor device with a sense FET probe located proximate a center of the device according to an embodiment of the present invention.
Figure 5B:
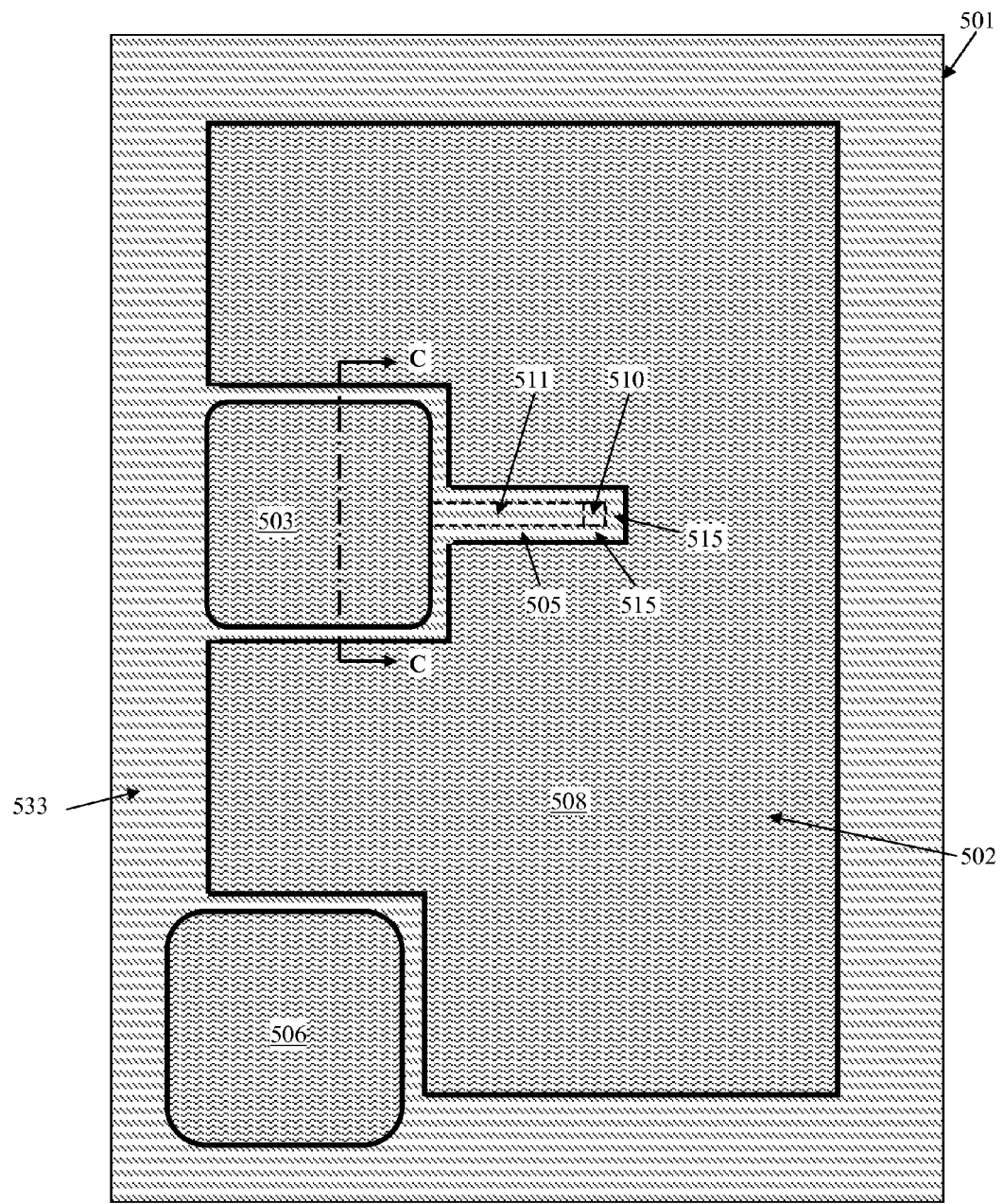
FIG. 5B is the top view of a semiconductor device of FIG. 5A, with the passivation layer shown.

FIG. 5B shows the same top view of semiconductor device 500 as FIG. 5A, except that in this view, a passivation layer 533 covers the entire die except for the main FET source pad 508, gate pad 506, and sense FET source pad 503. The location of the sense FET probe 510 and conductive finger 511, which are covered by the passivation layer 533, are indicated with dashed lines.

As shown in FIGS. 5A and 6B, the sense FET probe 510 is located in the center of the main FET 502 and may be isolated from the main FET 502 by the gap 505 and an isolation structure 515. By way of example, the isolation structure 515 may include an insulating layer 516 such as BPSG. The isolation structure may further include deep wells 512, which can be formed at the top portion of the N-epi layer 513 and under the insulating layer 516. The deep wells 512 isolate the source and body regions of the sense FET probe 510 from the main FET 502. The deep wells 512 have the same conductivity type as the body regions, but are deeper than the body regions. The layout of the deep wells 512 may more or less follow the layout of the gap 505 seen in FIG. 5A. The epitaxial layer is disposed over a semiconductor substrate layer 514.

As seen in FIGS. 5A and 6C, the conductive finger 511, sense FET source pad 503 and sense FET probe 510 are isolated from the main FET source pad 508 by gap 505 and the isolation structure 515. The deep wells 512 isolate the source and body regions of the sense FET probe 510 from the source and body regions of the main FET 502. The deep wells 512 also increase the breakdown in the termination regions and in the isolation structure 515 to ensure that breakdown will not first occur here (in the relatively small termination and isolation regions), thus improving the ruggedness of the device. Deep wells may also be used in the semiconductor device as part of a termination structure that surrounds the main FET (not shown).

The isolation structure 515 can be configured such that the sense FET 510 lies outside of isolation structure 515, (and therefore "outside" the main FET active area) but the transistor portion of the sense FET 510 is substantially surrounded by active cells of the main FET 502. In addition, the sense FET 502, probe metal 511, and sense FET source pad 503 can all be located outside of the isolation structure 515. Deep wells 512 may also be located under the sense FET source pad 503 (FIG. 7) and under the sense FET probe metal 511.

Similar to FIG. 2, as shown in FIG. 6C, the main FET 502 may include a plurality of FET structures, each of which includes a trenched gate 614, and a source 612 formed by suitable doping of portions of a body region 616 of the N-Epi layer 513. The gate 614 for each main FET device may be in the form of a trench lined with an insulator such as an oxide and filled with conductive polysilicon and may be connected to gate runners (not shown) which connect them to the gate metal (not shown). The gates 614 may run perpendicular to the trench gates running in the A-A cross section. Alternatively, gates 614 may run parallel to those shown in the A-A cross section, but are shown here as if perpendicular for illustrative purposes. The source 612 of one main FET cell may be connected in parallel to other such devices by a main FET source metal 618. The source region 612 may make electrical contact to the main FET source metal 618 through an insulating layer 515 by conductive vias 620, 621. A body contact 610 may be implanted at the bottom of the vias 620, 621 and 623.

The sense FET probe 510 may similarly include a plurality of device structures, each of which may include a trenched gate 622 electrically coupled to gate runner (not shown). The gate runners may be connected to the common gate metal (not shown). The gate runners may be electrically connected to the gate pad 506 by way of the outer gate metal 509. Sense FET source 602 is electrically coupled to other sense FET cells sources by way of a sense FET source metal 608 through vias 626. The trenched gate 622, source 602 and body region 606 may be configured as described above with respect to the main FET gate 614, source 612 and body 616.

The source and body regions of the main FET device and sense FET probe are formed in the same N-Epi layer 513 located on the (N+) substrate 514. The deep wells 512 isolate these main FET and sense FET's source and body regions.

Figure 7:
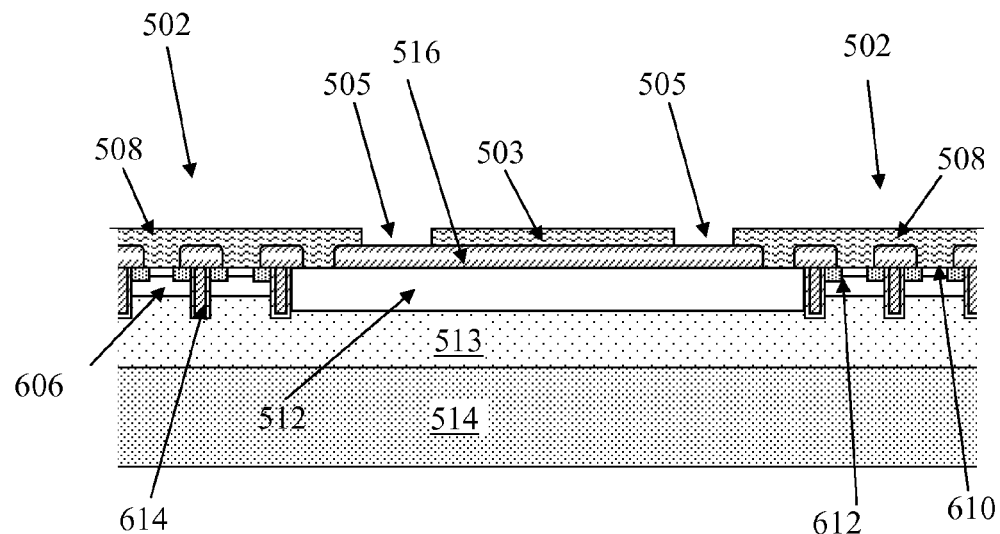
FIG. 7 is a cross-sectional view along a line A-A' of the semiconductor device of the FIGS. 5A-5B.

FIG. 7 is a cross-sectional view along line C-C' of the semiconductor device 500 of FIGS. 5A-5B. As shown in FIG. 7, the sense FET source pad 503 is isolated from the main FET 502 by gap 505, the insulating layer 516 and the deep well 512, which can run under the sense FET source pad 503.

As shown in FIGS. 5, 6B-6C and 7, the gate pad 506, the sense FET source pad 503 and the sense FET probe 510 can be located outside of the active area, i.e., in the termination region, of the main FET 502. The gate pad 506, the sense FET source pad 503 and the sense FET probe 510 can be together separated from the main FET 502 by isolation structure 515 with the sense FET source pad 503

Referring to FIG. 3A, the sense FET 304 is located at the center of the main FET 302 but under a relatively large source pad 303 (e.g., 150 micron by 150 micron) and it is hard to control the current spreading and therefore the current ratio of the sense FET current to the main FET current. By placing a relatively small sense FET probe, e.g., with a size of about 20 micron by 20 micron, at the center of the main die FET and connecting it to the sense FET pad by a narrow sense FET probe conductive finger, e.g., as described above with respect to FIGS. 5A-5B, it is easy to control the current spreading and therefore achieving the right current ratio, e.g., the actual sense ratio should be within 5% of the designed sense ratio. In addition, this set up puts the sense FET at a more similar temperature (which affects FET resistance/current) with the main FET to prevent distortion from the temperature differential due to the large sense FET source pad. A width from the edge of the main FET to the sense FET probe is about half of the main FET's width. Typically, the main FET may be approximately square or rectangular in shape with a size of about 1-10 mm$^2$)

Furthermore, a large temperature differential can also affect the current ratio and $R_{ds\text{-}on}$. By placing the sense FET in the center of the main FET and surrounded by main FET transistors, there is less of temperature differential between the main FET transistors and the sense FET transistors, without excessive distortion from the sense FET source pad. Multiple sense FET probes with a number of different current ratios can also be easily integrated into the center of the main FET.

Figure 8:
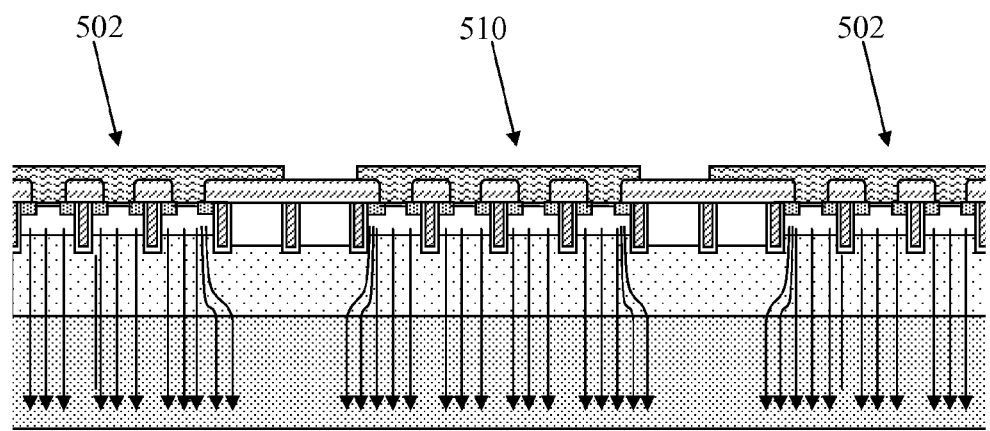
FIG. 8 is a schematic diagram showing current flow line for main die and sense FET probe.

FIG. 8 is a cross-sectional schematic diagram showing the current flow lines for main FET 502 and sense FET probe 510 of the semiconductor device of the type depicted in FIG. 5A. As shown in FIG. 8, less current spreading can be achieved due to the small spacing between sense FET probe and main FET, since the relatively large sense FET die pad (not shown) has been moved away from the sense FET probe 510. As a result, a desired current ratio can be achieved for the sense FET probe with minimal distortion, since $R_{dson}$ of the sense FET can be more accurately designed.

The semiconductor device of the type depicted in FIG. 5A can be applied in stripe or closed cell technology in gate trench power MOSFETs (including shield gate trench (SGT)) or planar gate power MOSFETs.

There are a number of different possible ways of fabricating semiconductor devices of the types discussed above in FIG. 5A. By way of example, FIGS. 9-9A and 10B-B' through 16B-B' and 10C-C' through 16C-C' are a series of cross-sectional schematic diagrams illustrating fabrication of a N-channel MOSFET semiconductor device of the type depicted in FIGS. 5A and 6 along the lines B-B' and C-C'. A similar technique may be used to fabricate a P-channel MOSFET device. Compared to the process described above in FIGS. 4A-4H, this process requires no additional manufacturing process and additional mask layers are required.

Figure 9:
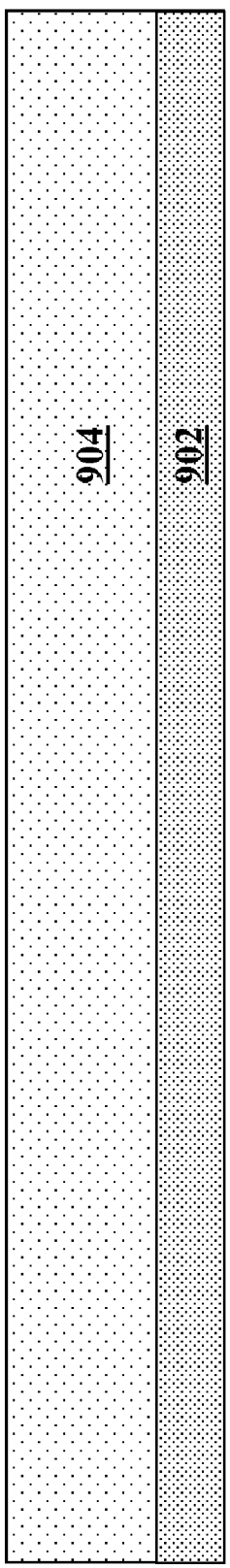
Figure 9A:
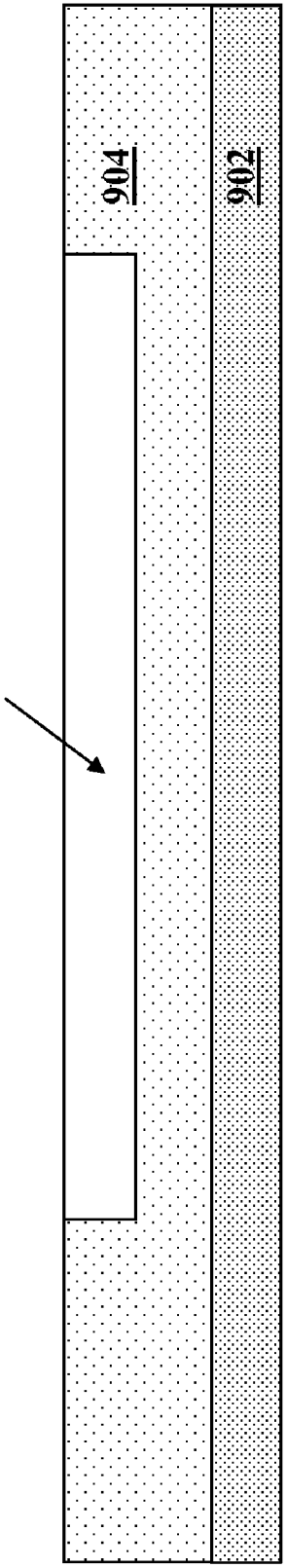

As shown in FIG. 9, an N-epi layer 904 may be formed on top of an N+ substrate 902. A deep well mask (not shown) is then formed on the on top of the N-epi layer 904. The epitaxial layer 904 may be implanted with dopants of an opposite polarity (i.e. conductivity type) to the doping of the epitaxial layer to form deep well 905A as shown in FIG. 9A.

A trench mask (not shown) is then formed on top of the N-epi layer 904. The N-epi layer 904 may be etched through the trench mask to a predetermined depth to form main FET gate trench 903, sense FET gate trench 905, and isolation trench 906 as shown in FIGS. 10B-B' and 10C-C'. Gate dielectric (e.g., oxide) 910 may then be grown on the sidewall of the trenches 903, 905 and 906. The trenches 903, 905 and 906 may then be filled with a conductive material 908, such as polysilicon, and then etched back as shown in FIGS. 11B-B' and 11C-C'. In this manner, source terminals, trench gates may all be formed simultaneously in a common sequence of process steps.

By way of example, with a body mask (not shown), P-type dopants may be implanted and annealed in the N-epi layer 904 proximate the main FET gate trenches 903, sense FET gate trenches 905 to form body regions 912 and 909, as shown in FIGS. 12B-B and 12C-C'. A depth of body implantation is less than a depth of deep well implantation. It is noted that in this example to fabricate an N-channel device, P-type dopants are implanted in the N-type doped epitaxial layer 904 to form the body regions 912 and 909. Alternatively, N-type dopants may be implanted in a P-type doped epitaxial layer for fabrication of a P-channel device.

N+ type dopants (in the case of n-channel MOSFET) are implanted and annealed to form main FET source regions 913 and the sense FET source regions 914 as shown in FIGS. 13B-B' and 13C-C'. An insulating layer 916, e.g., borophosphosilicate glass (BPSG), is depositing on top of the N-epi layer 904. The insulating layer 916 is masked and etched back to form contact openings 917 located on top of the deep well 905A and to form contact opening 930 and 931 for the main FET source and sense FET source, respectively, as shown in FIGS. 14B-B' and 14C-C'. Body contact implants 932 can be implanted at the bottom the contact openings 917, 930 and 931.

A conductive layer is deposited on top of the insulating layer 916 and into contact openings 917, 918, 930 and 931 and patterned to form a main FET source metal 921 and a sense FET source metal 922 and the sense FET source pad 925 as shown in FIGS. 15B-B' and 15C-C'. The conductive layer may be etched back to form opening 930 for isolation between the main FET source metal 921 and the sense FET source metal 922 and opening 932 for isolation between the main FET source metal 921 and the sense FET source pad 925 as shown in FIGS. 15B-B' and 15C-C'. A passivation layer 926 is finally deposited into the openings 930, 932 and deposited on top of the main FET source metal 921 and sense FET source metal 922 as shown in as shown in FIGS. 16B-B' and 16C-C'.

The method described above in FIGS. 9, 9A, 10B-B' through 16B-B' and 10C-C' through 16C-C' only shows the making of an N-channel main FET and a sense FET on a common substrate with the sense FET not being located under the sense FET source pad. However, multiple sense FETs with a number of different current ratio can be easily formed on a common substrate with main FET using this method without additional manufacturing process and additional mask layers required. Embodiments of the present invention allow the main FET, the sense FET and the electrical isolation between them to be formed from the same semiconductor substrate using common process steps. Although the nature and sequence of the steps used in fabricating devices according to embodiments of the present invention may be common, the masks used during the process steps are different in that they provide for fabrication of the electrical isolation as well as the FET devices.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A semiconductor device, comprising:
   a main field effect transistor (FET) including a source, a body and a gate;
   a sense FET including a source, a body and a gate, wherein a transistor portion of the sense FET is substantially surrounded by and proximate to transistors of the main FET;
   a sense FET source pad located at an edge of the semiconductor device wherein the sense FET source pad is spaced apart from the transistor portion of the sense FET and is connected to the transistor portion of the sense FET by a sense FET probe metal; and
   an electrical isolation structure configured to electrically isolate source and body regions of the main FET from source and body regions of the sense FET, wherein the main FET, the sense FET, and the electrical isolation are formed in a single semiconductor die and wherein the isolation structure is configured such that the transistor portion of the sense FET and the sense FET source pad are located outside an active area of the main FET, wherein the semiconductor device is a discrete vertical FET.

2. The semiconductor device of claim 1, wherein the sense FET probe metal, a main FET source metal, and a gate metal are separated portions of a single metal layer.

3. The semiconductor device of claim 1, wherein the sense FET probe metal is not a resistor.

4. The semiconductor device of claim 1 wherein the transistor portion of the sense FET is not wider than the sense FET probe metal.

5. The semiconductor device of claim 1, wherein the transistor portion of the sense FET is located proximate a center of the main FET.

6. The semiconductor device of claim 1, wherein the sense FET transistor portion, sense FET probe metal, and sense FET source pad are together separated from the main FET by the isolation structure and located with the sense FET source pad at a periphery of the main FET.

7. The semiconductor device of claim 1, wherein the isolation structure includes one or more deep wells formed at the top portion of an epitaxial layer, wherein the deep wells isolate source and body regions of the sense FET from the source and body regions of the main FET, wherein the deep wells have the same conductivity type as the main FET body regions.

8. The semiconductor device of claim 7, wherein the deep wells have a depth deeper than a depth of the main FET body regions.

9. The semiconductor device of claim 8 wherein the deep wells are between about 1 microns deep and about 2 microns deep and body regions of the main FET are between about 0.5 microns deep and about 0.7 microns deep.

10. The semiconductor device of claim 8, wherein the deep wells have a lower doping concentration than the main FET body regions.

11. The semiconductor device of claim 10 wherein the doping concentration of the deep wells is about $4\times10^{16}/cm^3$.

12. The semiconductor device of claim 7, wherein deep wells between the transistor portion of the sense FET and the main FET are about two cell pitches wide.

13. The semiconductor device of claim 7 wherein deep wells between the transistor portion of the sense FET and the main FET are about 2 to 10 microns wide.

14. The semiconductor device of claim 1, wherein the main FET and sense FET comprise metal oxide semiconductor field effect transistors (MOSFETs).

15. The semiconductor device of claim 1, wherein the electrical isolation structure between the sense FET and the main FET comprises body block rings proximate an isolation trench, wherein a metal layer located over the electrical isolation electrically connects the gate of the sense FET to the gate of the main FET.

16. A method for manufacturing a semiconductor device including one main field effect transistor (FET) and a sense FET, comprising:
a) forming a source, a body and a gate of a main FET in a substrate;
b) forming a source, a body and a gate of a sense FETs in the substrate, wherein the one sense FET is located proximate a center of the main FET, wherein a transistor portion of the FET is surrounded by and proximate to transistors of the main FET to reduce distortion and variations of the sense FET measurements, wherein the sense FET and the main FET are vertical FETs and share a common substrate;
c) forming an electrical isolation structure in the substrate configured to electrically isolate source and body regions of the main FET from source and body regions of the sense FET; and
d) forming a sense FET source pad located at an edge of the main FET and connected to the sense FET by a sense FET probe metal,
wherein the sense FET and the sense FET source pad are separated from main FET by the electrical isolation structure.

17. The method of claim 16 wherein a) through d) include:
i) forming a first conductivity type epitaxial (epi) layer on top of a heavily doped first conductivity type substrate;
ii) forming a deep well mask on top of the epi layer; and
iii) implanting dopants of a second conductivity type at a top portion of the epi layer in isolation structure regions of the semiconductor device to form deep well regions, the second conductivity type being the opposite of the first conductivity type.

18. The method of claim 17, wherein iii) further comprises forming deep well regions such that the deep well regions have a depth of about 1 to 2 microns and a doping concentration of about $4\times10^{16}/cm^3$.

19. The method of claim 16, further comprising:
forming main FET gate trenches, sense FET gate trenches, and an isolation trench,
wherein the isolation trench is located between the main FET and the sense FET and comprises a part of said electrical isolation, wherein the isolation trench is not connected to the gate voltage;
depositing an insulation layer over said electrical isolation; and
forming a metal layer over the insulation layer over said electrical isolation, said metal layer connecting the gate of the sense FET to the gate of the main FET.

20. The method of claim 16, wherein said semiconductor device is a discrete vertical FET.

* * * * *